(12) United States Patent
Smith et al.

(10) Patent No.: US 12,174,655 B1
(45) Date of Patent: Dec. 24, 2024

(54) METHOD FOR OPTICAL COMPUTATION OF SUMS AND DIFFERENCES

(71) Applicant: OPĒ, LLC, Theodore, AL (US)

(72) Inventors: Joshua Norman Smith, Mobile, AL (US); Robert Chad Mccollum, Mobile, AL (US)

(73) Assignee: OPĒ, LLC, Theodore, AL (US)

( * ) Notice: Subject to any disclaimer, the term of this patent is extended or adjusted under 35 U.S.C. 154(b) by 96 days.

(21) Appl. No.: 18/181,300

(22) Filed: Mar. 9, 2023

Related U.S. Application Data

(60) Division of application No. 17/384,769, filed on Jul. 25, 2021, now Pat. No. 11,635,783, which is a continuation of application No. 16/742,825, filed on Jan. 14, 2020, now Pat. No. 11,119,527, which is a continuation of application No. 14/670,197, filed on Mar. 26, 2015, now Pat. No. 10,545,529.

(Continued)

(51) Int. Cl.
*G06E 3/00* (2006.01)
*G02B 19/00* (2006.01)

(52) U.S. Cl.
CPC ......... *G06E 3/005* (2013.01); *G02B 19/0066* (2013.01); *G02B 19/0071* (2013.01); *G02B 19/0076* (2013.01)

(58) Field of Classification Search
CPC ............ G02B 19/0066; G02B 19/0071; G02B 19/0076; G02B 19/0047; G02B 19/0052; G02B 19/0057; G02B 19/0061; G02B 19/0085; G02B 19/009; G06E 3/005; G06E 3/00; G06E 3/001

USPC ....................................................... 359/107
See application file for complete search history.

(56) References Cited

U.S. PATENT DOCUMENTS

| | | | |
|---|---|---|---|
| 4,382,660 A | 5/1983 | Pratt, Jr. et al. | |
| 4,729,111 A | 3/1988 | Arrathoon et al. | |

(Continued)

FOREIGN PATENT DOCUMENTS

WO   WO 2014087126 A1   6/2014

OTHER PUBLICATIONS

Dolev, Shlomi et al., "Optical Supercomputing, Third International Workshop, OSC 2010, Bertino, Italy, Nov. 2010, Revised Selected Papers," 2011, Springer Verlag Berlin Heidelberg.

(Continued)

*Primary Examiner* — Arnel C Lavarias
(74) *Attorney, Agent, or Firm* — ASLAN LAW, P.C.

(57) ABSTRACT

An optical numerical computation method obtains operands that have respective values and modulates light sources to output light at amplitudes proportional to the operands. The light output for a given operand depends on whether the operand is positive or negative. The positive operands are output at wavelengths different from the negative operands. For operands that have multiple digits, the digits are separately treated so that the least significant digits are modulated with light sources at one frequency, and the most significant digits in two-digit numbers are modulated at another frequency, with positive and negative operands modulated at different frequencies. The light from the light sources enters a light collection cavity where it is sensed with sensors that generate resultant outputs at values indicative of the sensed light value.

12 Claims, 29 Drawing Sheets

Related U.S. Application Data

(60) Provisional application No. 62/035,995, filed on Aug. 11, 2014.

(56) References Cited

U.S. PATENT DOCUMENTS

| | | | |
|---|---|---|---|
| 4,888,724 A | 12/1989 | Marom et al. | |
| 5,010,505 A | 4/1991 | Falk et al. | |
| 5,239,173 A | 8/1993 | Yang | |
| 5,446,579 A | 8/1995 | Lomashevitch | |
| 5,519,534 A | 5/1996 | Smith et al. | |
| 5,646,395 A | 7/1997 | Miller | |
| 5,770,851 A | 6/1998 | Park et al. | |
| 6,118,397 A * | 9/2000 | Heflinger | G02F 7/00 341/137 |
| 6,326,910 B1 | 12/2001 | Hayduk et al. | |
| 6,804,412 B1 | 10/2004 | Wilkinson | |
| 6,990,281 B2 | 1/2006 | Shahar et al. | |
| 7,554,707 B1 | 6/2009 | Golshan | |
| 7,747,102 B2 | 6/2010 | New et al. | |
| 8,610,839 B2 | 12/2013 | New et al. | |
| 9,110,006 B1 | 8/2015 | Hovde et al. | |
| 9,280,848 B1 | 3/2016 | Chen et al. | |
| 9,423,346 B2 | 8/2016 | Xu | |
| 10,545,529 B1 * | 1/2020 | Smith | G02B 19/0023 |
| 11,119,527 B1 * | 9/2021 | Smith | G02B 19/0076 |
| 11,635,783 B1 * | 4/2023 | Smith | G02B 19/0066 359/107 |
| 2005/0211881 A1 | 9/2005 | Ponomarenko | |
| 2005/0276441 A1 | 12/2005 | Debevec | |
| 2012/0182545 A1 | 7/2012 | Proehl et al. | |
| 2014/0270758 A1 | 9/2014 | Nejadmalayeri et al. | |

OTHER PUBLICATIONS

Dolev, Shlomi et al., "Optical Supercomputing, Second International Workshop, OSC 2009, Bertinoro, Itlay, Nov. 2009 Proceedings," 2009, Springer-Verlag Berlin Heidelberg.

Goswami, Debabrata, "Optical Computing," Resonance: Journal of Science Education, Jun. 2003, pp. 56-71, vol. 8, Issue 6, Springer, India.

"Enclose," Merriam-Webster, https://www.merriam-webster.com/dictionary/enclose, Jun. 20, 2019.

Communication dated Nov. 2, 2016, issued by the USPTO in U.S. Appl. No. 14/294,212.

Dolev, Shlomi and Oltean, Mihai, "Optical Supercomputing, 4th International Workshop, OSC 2012 in Memory of H. John Caulfield Bertino, Italy 2012, Revised Selected Papers," 2013 Springer-Verlag Berlin Heidelberg.

Bengi, Kemal, Optical Packet Access Protocols for WDM Networks, 2002, vol. 1 of Broadband Networks and Services, Springer Science & Business Media, New York.

Woods, Damien and Naughton, Thomas J., "Optical Computing," Applied Mathematics and Computation, Oct. 2009, pp. 1417-1430, vol. 215, Issue 4, Elsevier Science Inc. New York, US.

Woods, Damien and Naughton, Thomas J., "Optical Computing: Photonic Nuetral Networks," Nature Physics, Apr. 2012, pp. 257-259, vol. 8, Nature Publishing Group.

Woods, Damien and Gibson, J. Paul, "Lower Bounds on the Computational Power of an Optical Model of Computation," Unconventional Computation, Oct. 2005, pp. 237-250, Springer, Berlin, Heidelberg.

Woods, Damien and Gibson, J. Paul, "Complexity of Continuous Space Machine Operations," New Computational Paradigms, Jun. 2005, pp. 540-551, Springer, Berlin, Heidelberg.

Woods, Damien and Naughton, Thomas J., "An Optical Model of Computation," Theoretical Computer Science, Apr. 2005, pp. 227-258, vol. 334, Issues 1-3, Elsevier Science Publishers Ltd. Essex UK.

Naughton, Thomas J. and Woods, Damien, "On the Computational Power of a Continuous-Space Optical Model of Computation," In: MCU '01 Proceedings of the Third International Conference on Machines, Computations, and Univerality, May 2001, pp. 288-299, Springer-Verlag London UK.

Lee, John N., Design Issues in Optical Processing, 1995, Cambridge University Press, New York NY USA.

Vanderlugt, Anthony, Optical Signal Processing, 2005, John Wiley & Sons, Inc. Hoboken, New Jersey.

McAulay, Alastair D., Optical Computer Architectures: The Applications of Optical Concepts to Next Generation Computers, 1991, John Wiley & Sons, Inc. New York NY USA.

Karim, Mohammad A. and Awwal, Abdul A.S., Optical Computing: An Introduction, 1992, John Wiley & Sons, Inc. New York NY USA.

Abate, Tom, "Standford Bioengineers Create Circuit Board Modeled on the Human Brain," Stanford Report, retrieved from: http://news.standford.edu/pr/2014/pr-neurogrid-boahen-engineering-042814.html, Apr. 28, 2014, n.p., Aug. 22, 2017.

\* cited by examiner

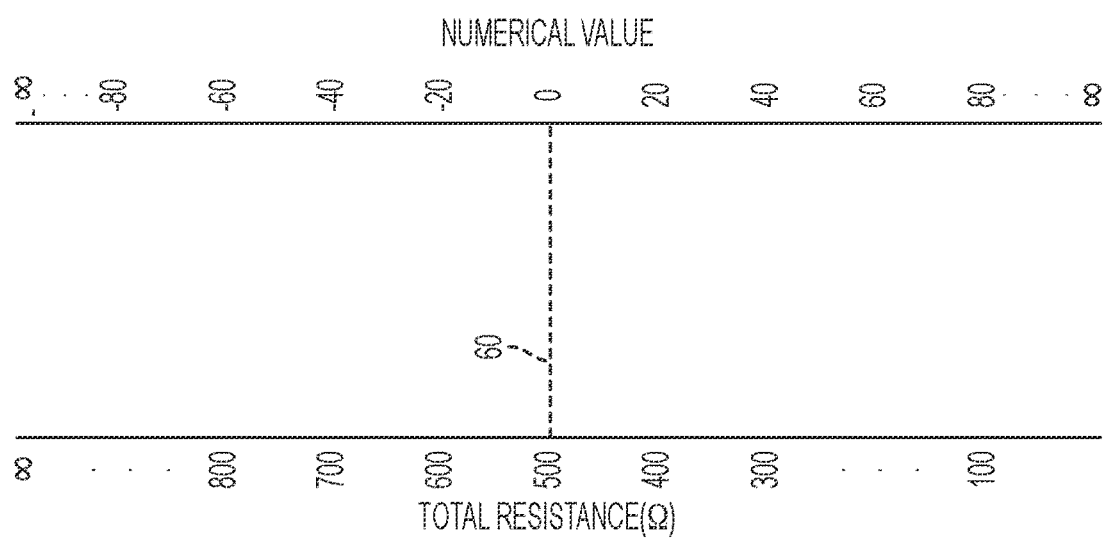

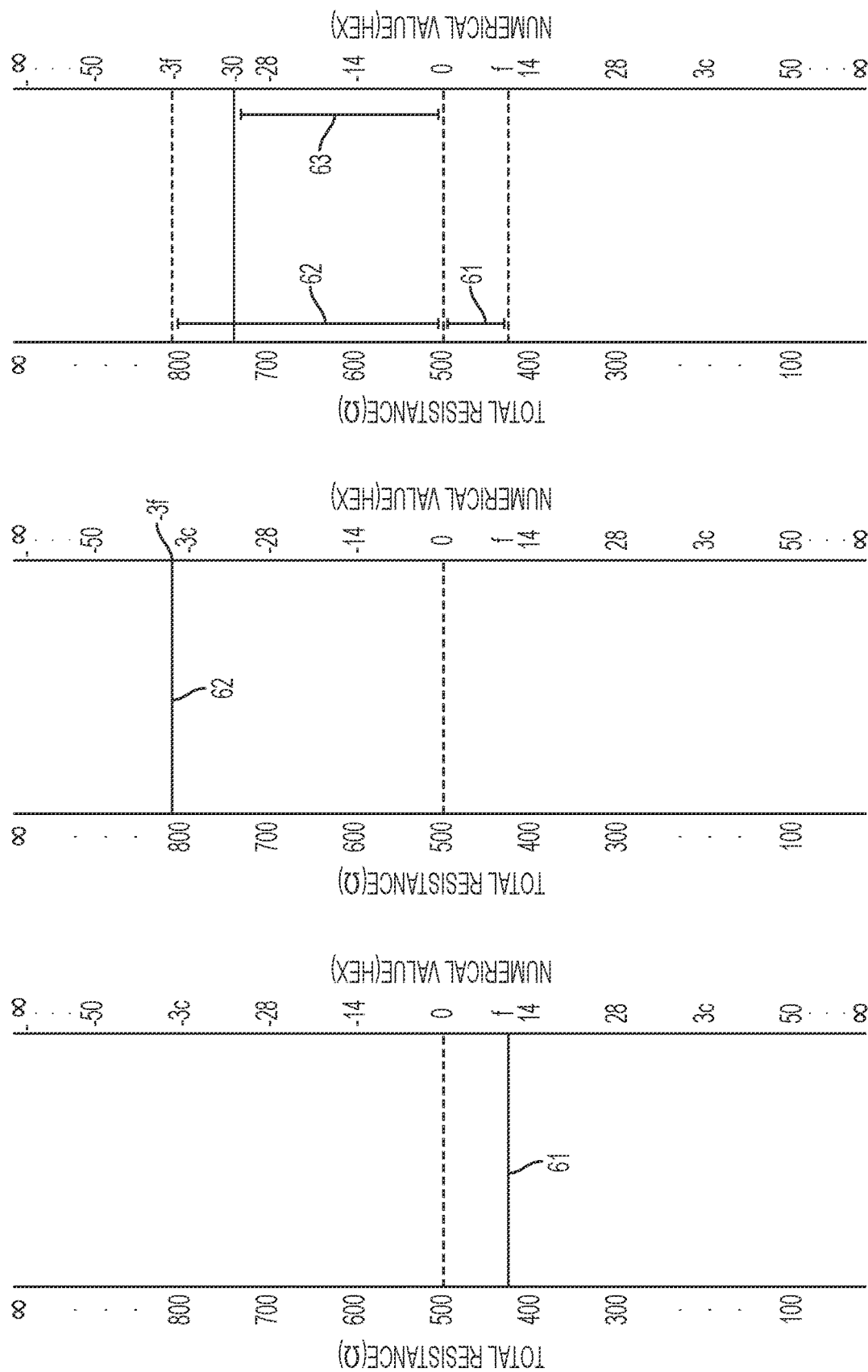

METHOD FOR OPTICAL COMPUTATION OF SUMS AND DIFFERENCES

CROSS-REFERENCE TO RELATED APPLICATIONS

This application is a divisional of U.S. application Ser. No. 17/384,769 filed on Jul. 25, 2021, which is a continuation of U.S. application Ser. No. 16/742,825 filed on Jan. 14, 2020 (now U.S. Pat. No. 11,119,527), which is a continuation of U.S. application Ser. No. 14/670,197 filed on Mar. 26, 2015 (now U.S. Pat. No. 10,545,529), which claims the benefit of U.S. provisional application No. 62/035,995 filed Aug. 11, 2014, the contents of all of which are incorporated by reference, herein, in their entirety. This application is related to commonly-assigned U.S. non-provisional application Ser. No. 14/294,212 filed Jun. 3, 2014 (now U.S. Pat. No. 9,939,711), commonly-assigned U.S. non-provisional application Ser. No. 15/853,177 filed Dec. 17, 2022 (now U.S. Pat. No. 10,551,720), commonly-assigned U.S. non-provisional application Ser. No. 16/752,635 filed Jan. 25, 2020 (now U.S. Pat. No. 11,137,664), and commonly-assigned U.S. provisional application No. 61/922,633 filed Dec. 31, 2013, the contents of all of which are also incorporated by reference, herein, in their entirety.

FIELD

The instant application relates to an optical numerical computation method and apparatus which performs arithmetic operations, specifically addition and subtraction.

SUMMARY

The following embodiments describe an optical numerical computation method which utilizes multiple wavelengths of light in order to perform arithmetic operations. Light of similar or identical wavelengths representing numerical operands interacts to produce a cumulative light which is subsequently sensed by a corresponding light sensor of a plurality of light sensors. Voltages across the plurality of light sensors are determined, those voltages being determined by the total light of a particular wavelength incident upon each light sensor. The aforementioned voltages are subsequently combined to determine an arithmetic sum or difference of values corresponding to the inputted values of light.

The following embodiments also describe an optical numerical valuing system which may be used in conjunction with the aforementioned optical calculation apparatus.

The following embodiments further describe a light collection cavity and methods of constructing the same.

In an embodiment, an optical numerical computation method includes obtaining operands including a first operand and a second operand. It also includes representing the operands using a numbering system in which the numbering system has a base b and represents numerical values of the operands using n digits in n respective positions where n is an integer and $n \geq 1$. In this numbering system, each digit $d_i$ of the digits of a given operand has: a respective position $p_i$ where $0 \leq i < n$, i being an integer, a respective value $v_i$, such that $0 \leq v_i \leq (b-1)$, a respective numeric value of $v_i(b^i)$, and a respective order of magnitude based on $b^i$. The operands have a respective least significant digit $d_0$ (LSD) of the n digits in the respective position $p_0$ and a most significant digit $d_{n-1}$ (MSD) of the n digits in the respective position $p_{n-1}$. The method also involves providing a plurality of light sources including one or more first light sources for the first operand and one or more second light sources for the second operand, the one or more first light sources including at least a first LSD light source, and the one or more second light sources including at least a second LSD light source. It also includes modulating the first LSD light source to output respective first light at a first wavelength $\lambda_1$ and with a first amplitude proportional to the respective value of the respective least significant digit of the first operand and also modulating the second LSD light source to output respective second light at the first wavelength $\lambda_1$ and with a second amplitude proportional to the respective value of the respective least significant digit of the second operand. It also includes receiving the light from the plurality of light sources inside a light collection cavity that has an inner surface devoid of openings that admit light from other than the plurality of light sources. The method also includes providing one or more light sensors and sensing the first light and the second light, in the light collection cavity, using a first LSD light sensor of the one or more light sensors, to obtain a first LSD sum of the first amplitude and the second amplitude.

In an aspect of the method, it also includes providing the one or more first light sources so as to include a first MSD light source, providing the one or more second light sources so as to include a second MSD light source, modulating the first MSD light source to output respective third light at a second wavelength $\lambda_2$ and with a third amplitude proportional to the respective value of the respective most significant digit of the first operand, modulating the second MSD light source to output respective fourth light at the second wavelength and with a fourth amplitude proportional to the respective value of the respective most significant digit of the second operand, and sensing the third light and the fourth light, in the light collection cavity, using a first MSD light sensor of the one or more light sensors, to obtain a first MSD sum of the third amplitude and the fourth amplitude.

In a further aspect, the method includes obtaining the operands to include a third operand and a fourth operand, the third operand and the fourth operand representing negative numbers. It also includes providing the plurality of light sources including one or more third light sources for the third operand and one or more fourth light sources for the fourth operand, the one or more third light sources including at least a third LSD light source and a third MSD light source, and the one or more fourth light sources including at least a fourth LSD light source and a fourth MSD light source. It also includes modulating the third LSD light source to output respective fifth light at a third wavelength $\lambda_3$ and with a fifth amplitude proportional to the respective value of the respective least significant digit of the third operand, modulating the fourth LSD light source to output respective sixth light at the third wavelength $\lambda_3$ and with a sixth amplitude proportional to the respective value of the respective least significant digit of the fourth operand, modulating the third MSD light source to output respective seventh light at a fourth wavelength $\lambda_4$ and with a seventh amplitude proportional to the respective value of the respective most significant digit of the third operand, and modulating the fourth MSD light source to output respective eighth light at the fourth wavelength $\lambda_4$ and with an eighth amplitude proportional to the respective value of the respective most significant digit of the fourth operand. It also includes sensing the fifth light and the sixth light, in the light collection cavity, using a second LSD light sensor of the one or more light sensors, to obtain a second LSD sum of the fifth amplitude and the sixth amplitude. It also includes sensing the seventh light and the eighth light, in the light collection cavity, using a second MSD light sensor of the one or more light sensors, to obtain a second MSD sum of the seventh amplitude and the eighth amplitude.

In a yet further aspect, the method includes scaling the first LSD sum and the first MSD sum according to the respective order of magnitude of the respective least significant digit and the respective order of magnitude of the respective most significant digit of one of the first operand and the second operand to provide a first voltage output representation of a sum of the first operand and the second operand, scaling the second LSD sum and the second MSD sum according to the respective order of magnitude of the respective most significant digit and the respective order of magnitude of the respective most significant digit of one of the third operand and the fourth operand to provide a second voltage output representation of a sum of the third operand and the fourth operand, inverting the second voltage output representation and combining it with the first voltage output to determine a calculation result related to the operands, and generating an output based on the calculation result.

In an alternative further aspect, the method includes providing the one or more first light sources as visible light sources, providing the one or more second light sources as infrared light sources, providing the first LSD light sensor and the first MSD light sensor as visible light sensors of the one or more light sensors, providing the second LSD light sensor and the second MSD light sensor as infrared light sensors of the one or more light sensors, providing at least one of the one or more light sensors so as to have a respective resistance that increases as sensed light increases, as a first signed sensor; providing at least one other of the one or more light sensors so as to have a respective resistance that decreases as sensed light increases, as a second signed sensor, and coupling the first signed sensor in series with the second signed sensor to effect a difference computation.

In another embodiment, an optical numerical computation method includes obtaining operands, including a first operand having a first respective value and a first respective sign, and including a second operand having a second respective value and a second respective sign. It also includes providing light sources to emit light, including a first light source to emit first light and a second light source to emit second light. It also includes modulating the first light source to output the first light with a first amplitude proportional to the first respective value at a first wavelength $\lambda_1$, and modulating the second light source to output the second light with a second amplitude proportional to the second respective value, including, when the first respective sign matches the second respective sign, outputting the second light at the first wavelength $\lambda_1$, and when the first respective sign does not match the second respective sign, outputting the second light at a second wavelength $\lambda_2$. The method also includes providing the light inside a light collection cavity that has an inner surface devoid of openings that admit light from other than the light sources. It also includes providing light sensors adapted to sense the light in the light collection cavity, including a first light sensor and a second light sensor, and the first light sensor is adapted to sense the light having the first wavelength $\lambda_1$ and to have a respective resistance that decreases as sensed light increases, and the second light sensor is adapted to sense the light having the second wavelength $\lambda_2$ and to have a respective resistance that increases as sensed light increases, the second light sensor being coupled in series with the first light sensor. It also includes sensing the light, including the first light and the second light, in the light collection cavity, using the light sensors, to obtain a resultant value; and outputting the resultant value as a calculation result of combining the operands.

In one aspect of this embodiment, a given one of the light sources outputs visible light and a different one of the light sources outputs infrared light. In another aspect of this embodiment, a given one, of the light sources, outputs light from 315 nm through 710 nm and a different one, of the light sources, outputs light from 800 nm through 2500 nm. In yet another aspect of this embodiment, a given one, of the light sources, outputs infrared light in a first phase, a different one, of the light sources, outputs infrared light in a second phase different from the first phase.

In an alternative aspect of this embodiment, the method also includes obtaining the operands so as to include a third operand having a third respective value and a third respective sign. It also includes providing the light sources so as to include a third light source to emit third light. It also includes modulating the third light source to output the third light with a third amplitude proportional to the third respective value, including, when the first respective sign matches the third respective sign, outputting the third light at the first wavelength $\lambda_1$, and when the first respective sign does not match the third respective sign, outputting the third light at the second wavelength $\lambda_2$.

BRIEF DESCRIPTION OF THE DRAWINGS

FIG. 2A shows an example embodiment of a light collection cavity formed on a substrate such as a Si board or the like.

FIG. 2B shows a cross-sectional view of an example embodiment of a light collection cavity formed on a substrate such as a Si board or the like.

FIG. 2C shows an example embodiment of a cross-section view of a light collection cavity formed on a substrate such as a Si board or the like.

FIG. 9A shows a plot of total resistance and corresponding numerical value versus time according to an example embodiment of the instant application.

FIG. 9E shows a plot of total resistance and corresponding numerical value versus time according to an example embodiment of the instant application.

FIG. 9F shows a plot of total resistance and corresponding numerical value versus time according to an example embodiment of the instant application.

FIG. 9G shows a plot of total resistance and corresponding numerical value versus time according to an example embodiment of the instant application.

DETAILED DESCRIPTION

In previously-copending U.S. application Ser. No. 14/294,212, (referred to hereafter, below, as the "related application") a description is provided of example embodiments relating to a computing apparatus capable of performing addition by relating light. The following paragraphs and drawing figures of that application are specifically noted herein, by this reference, for their useful background information on an approach to implementing an optical numerical computation apparatus: paragraphs [0043] through [0101] and FIGS. 1-5. FIGS. 6-39 are also helpful in understanding a specific implementation of the same and are hereby incorporated by reference for such information.

A first general example embodiment of the instant application provides for an optical numerical computation apparatus capable of performing an addition function and also a subtraction function. According to example embodiments of the instant application, multiple wavelengths of light are used. In the first general example embodiment, the aforementioned multiple wavelengths of light interact with respective light sensors that are adapted to sense the wavelengths. In a second exemplary embodiment, the aforementioned multiple wavelengths of light interact with light sensors in series with one another.

Figure 1:
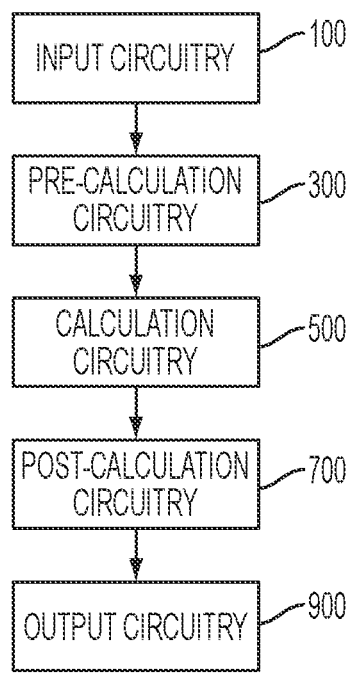
FIG. 1 shows an optical numerical computation device.

FIG. 1 shows an optical numerical computation device according to the first general example embodiment which is configured to relate light values in order to calculate an arithmetic solution. In FIG. 1, input circuitry 100 includes, for instance, a keyboard for input by a user, or adaptive circuitry that receives inputs from a digital computing device.

These signals received by input circuitry 100 represent operands of a numerical operation to be performed thereto. The numerical operation may be simple or complex, and, for example, may include a request to add, subtract, or otherwise arithmetically compute some value.

Input circuitry 100 is further configured to output an indication of operands of the numerical operation. While the term "circuitry" usually refers to an electrical device, the term herein is used additionally to refer to optical devices (i.e., optical circuits and the like).

Pre-calculation circuitry 300 is configured to output one or more light source control signals based at least on respective values of the operands produced by the input circuitry 100, and to generate the light source control signals so that an amplitude of light emitted by one or more of the plurality of light sources represents the respective value of one of the operands.

Pre-calculation circuitry 300 is not limited to accepting operands in standard base systems (i.e., bases 2, 8, 10, and 16). Operands with arbitrary bases are, in example embodiments, processed by pre-calculation circuitry 300.

Each light source of the plurality of light sources emits light at a respective wavelength.

The calculation circuitry 500 is configured to respond to the light source control signals by controlling the plurality of light sources to emit light representing the respective values of the operands, and to relate the emitted light so as to generate one or more resultant outputs. Calculation circuitry 500 includes a light collection cavity with an inner surface which defines an interior space, and a plurality of light computation components including the light sources and one or more light sensors.

The light computation components are arranged in a variety of patterns, according to example embodiments, including a radial pattern. Further, the light computation components are, in other example embodiments, arranged on the same hemisphere of a light collection cavity, preferably within an arc of 100 degrees or less.

Post-calculation circuitry 700 is configured to determine a calculation result for the numerical operation based on a combination of the one or more resultant outputs, and to generate a representation of the calculation result.

Output circuitry 900 includes an output device such as a display or digital interface or the like and is configured to output the calculation result based on the aforementioned representation in a format capable of being interpreted by a human or in a format capable of being interpreted by a digital computer. In other words, according to example embodiments, the output circuitry 900 does not include a display, but simply outputs the calculation result in a format that can be used by a digital computing device.

Figure 2A:
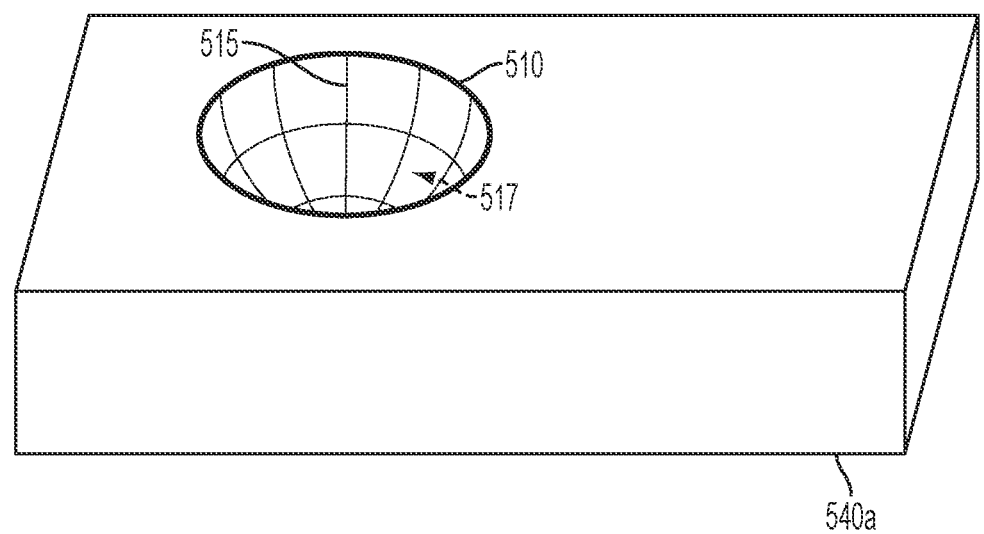

FIG. 2A shows a substrate 540a such as a Si board or the like. A portion of a light collection cavity 510 is disposed in the substrate 540a. The creation of the portion of the light collection cavity 510 is accomplished by any conventional method, including additive or subtractive manufacturing techniques. Although the light collection cavity portion 510 is shown as a hemisphere, this is only for illustration and other shapes may be used. A generally spherical light collection cavity 510 is shown throughout these drawing figures and is a cavity shape that has been found suitable. It is also possible to form the light collection cavity 510 using a polyhedron shape.

In FIG. 2A, reference numeral 510 indicates a light collection cavity, 515 indicates an inner surface of the light collection cavity, and 517 indicates an interior space of the light collection cavity.

Figure 2B:
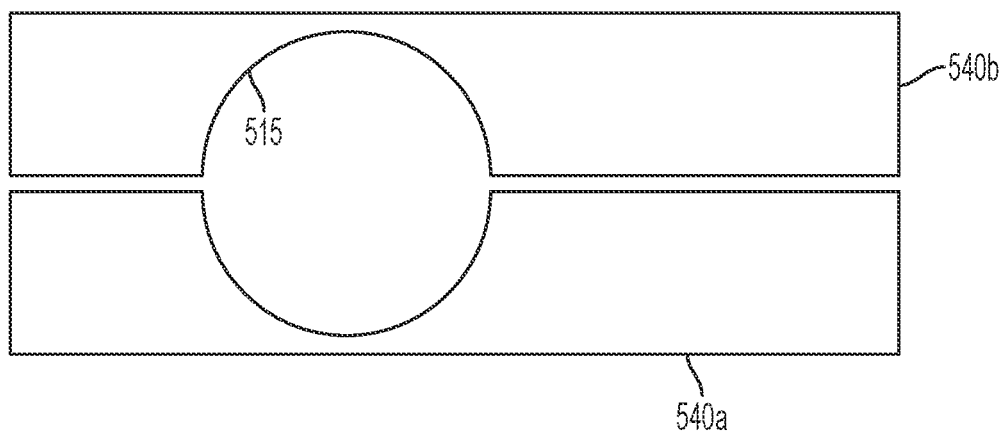

FIG. 2B shows the substrate 540a from FIG. 2A in a cross-sectional view, as well as a substrate 540b, which includes the other hemisphere of the light collection cavity 510, i.e., the portion not provided by substrate 540a.

Figure 2C:
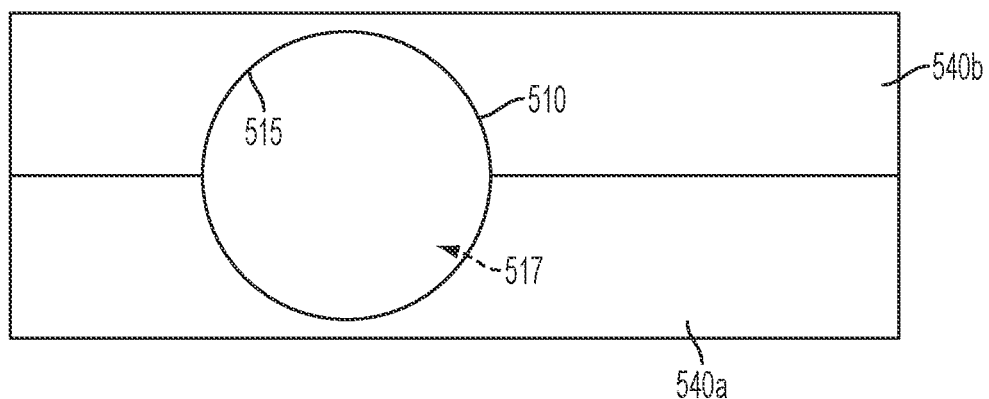

FIG. 2C shows the assembly of substrates 540a and 540b in cross-section. When the two substrates are combined, with proper orientation, the light collection cavity 510 is complete, providing an interior surface 515 and an interior space 517.

Figure 3A:
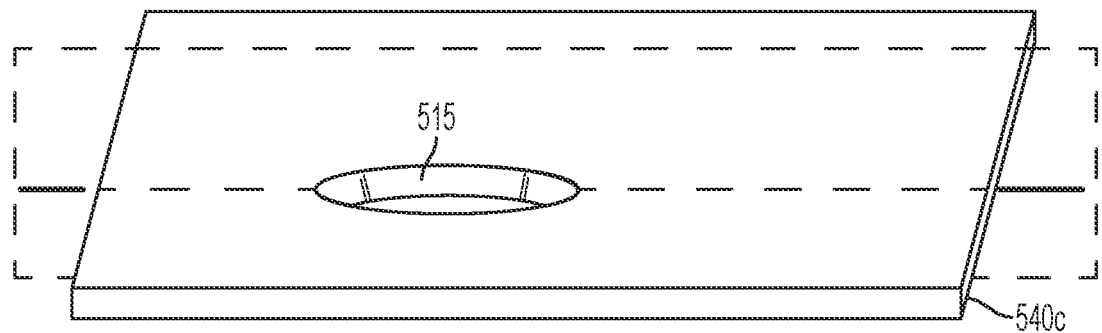
FIG. 3A shows a substrate that is used in the creation of a final assembly similar to that shown in FIG. 2C.
Figure 3B:
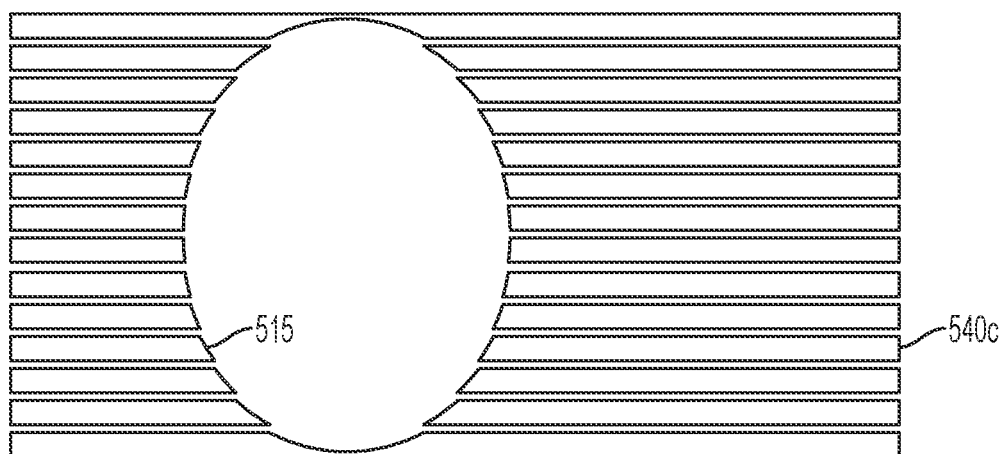
FIG. 3B shows multiple layers of a substrate separated that are used in the creation of a final assembly similar to that shown in FIG. 2C.
Figure 3C:
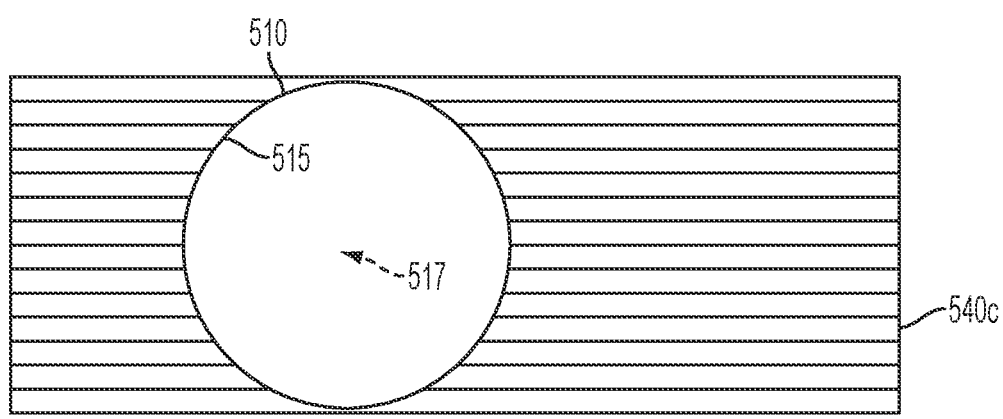
FIG. 3C shows multiple layers of a substrate bonded together that are used in the creation of a final assembly similar to that shown in FIG. 2C.

FIG. 3A shows a substrate 540C that is used in the creation of a final assembly similar to that shown in FIG. 2C. A difference between FIGS. 3C and 2C is that the light collection cavity shown in FIG. 3C is formed from a number of boards sandwiched together as shown in FIG. 3B. A purpose of FIGS. 3A, 3B, and 3C is to explain that the light collection cavity may be created from the combination of a plurality of adjacent substrates so as to facilitate production according to the needs of the project, the thickness of the available materials, the size of the light collection cavity desired, and the shape of the light collection cavity.

Figure 4A:
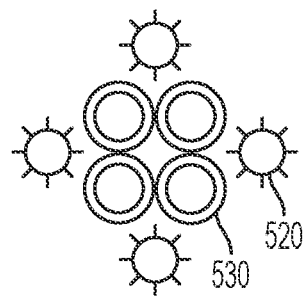
FIG. 4A shows an arrangement of light sources and light sensors.
Figure 4B:
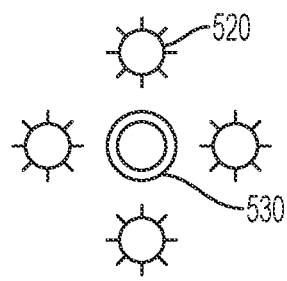
FIG. 4B shows an arrangement of light sources and light sensors.
Figure 4C:
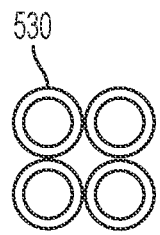
FIG. 4C shows an arrangement of light sources and light sensors.
Figure 4C:
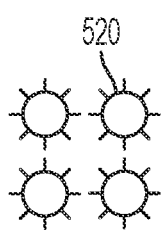
Figure 4D:
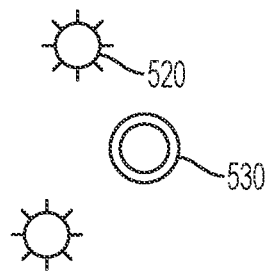
FIG. 4D shows an arrangement of light sources and light sensors.
Figure 5A:
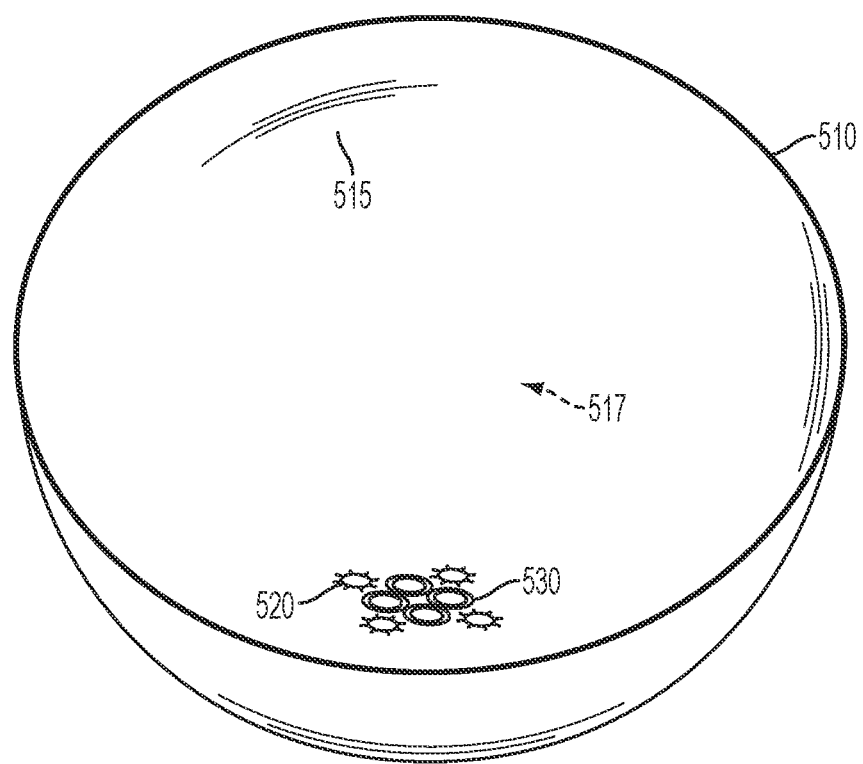
FIG. 5A shows the arrangement of FIG. 4A interposed on the interior of one hemisphere of a light collection cavity.
Figure 5B:
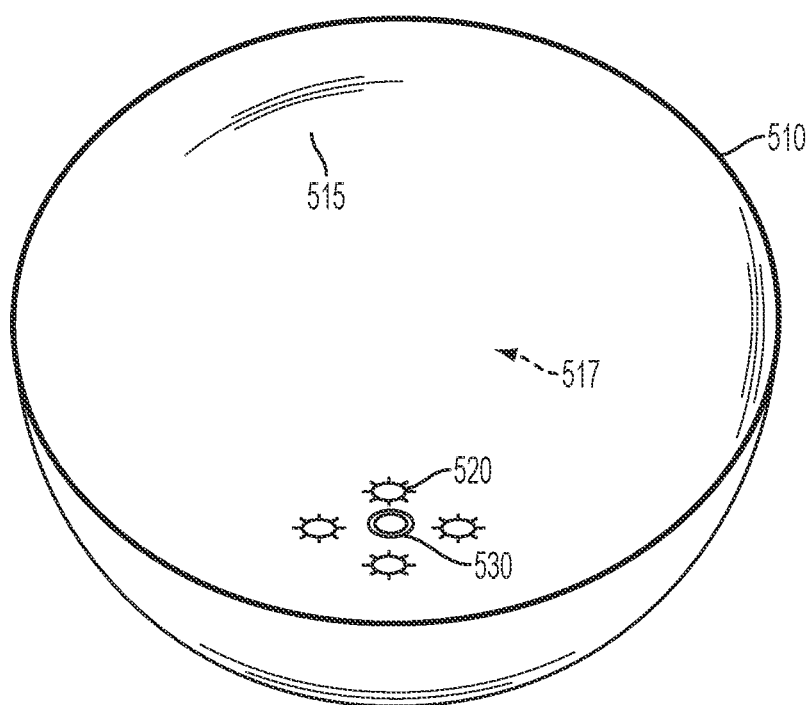
FIG. 5B shows the arrangement of FIG. 4B interposed on the interior of one hemisphere of a light collection cavity.
Figure 5C:
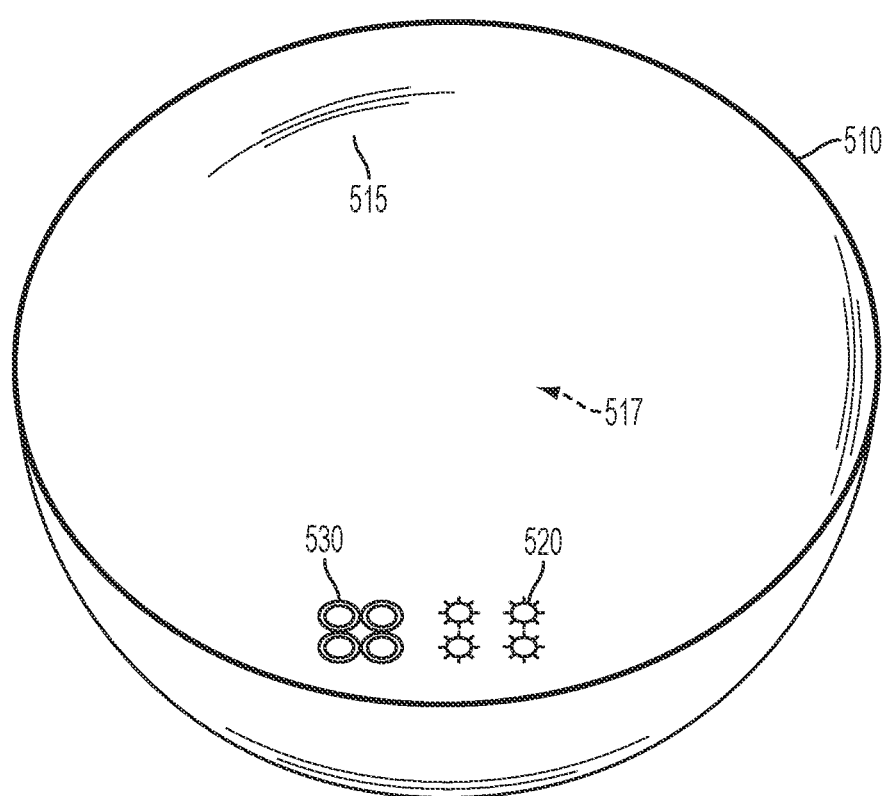
FIG. 5C shows the arrangement of FIG. 4C interposed on the interior of one hemisphere of a light collection cavity.
Figure 5D:
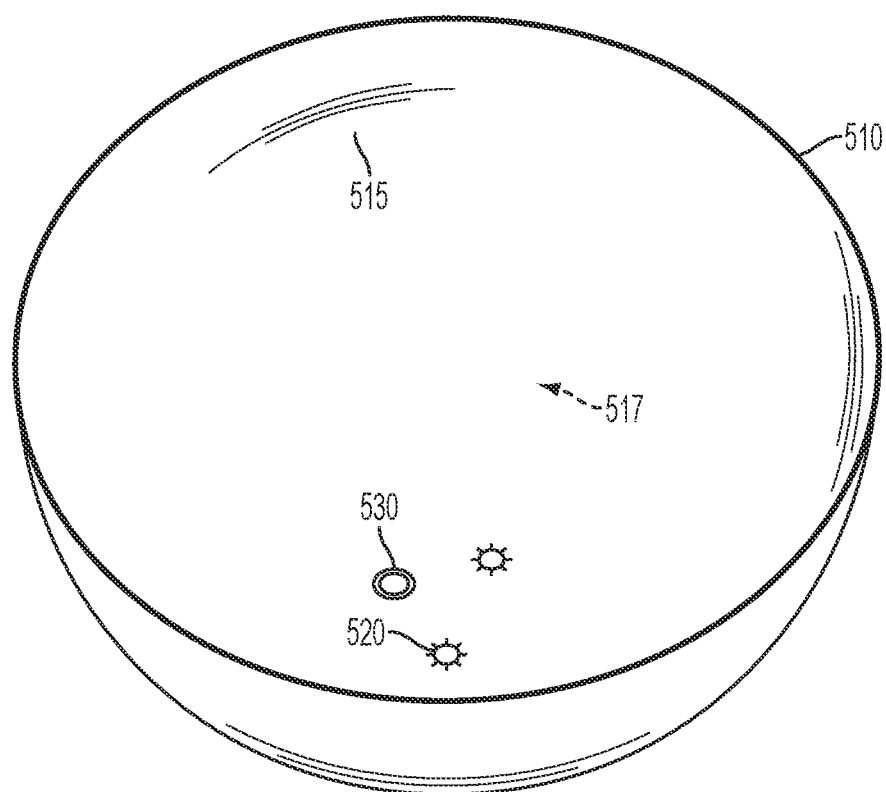
FIG. 5D shows the arrangement of FIG. 4D interposed on the interior of one hemisphere of a light collection cavity.

FIGS. 4A-4D show several arrangements of light sources 520 and the light sensors 530. In FIG. 4A, a plurality of light sources 520 are arranged around a plurality of light sensors 530. In FIG. 4B, a plurality of light sources 520 are arranged around a single light sensor 530. In FIG. 4C, a plurality of light sources 520 are arranged adjacent to a plurality of light sensors 530. In FIG. 4D, two light sources 520 are arranged in the vicinity of a light sensor 530. The arrangement of light sources 520 and light sensors 530 is not limited to the configurations shown in FIGS. 4A-4D. For instance, an alternative embodiment features more sensors than sources, with multiple sensors sensing the same wavelength of light in order to increase accuracy or for other purposes such as redundancy and/or fault tolerance.

FIGS. 5A-5D show several patterns from FIGS. 4A-4D arranged in the bottom of a hemispherical portion of a light collection cavity 510. FIGS. 5A-5D also illustrate the interior surface 515 of the light collection cavity 510, as well as the interior space 517. The interior surface 515 is, as illustrated in FIGS. 5A-5D and throughout the description, devoid of openings that admit light, from other than the plurality of light emitters, into the interior space 517. In FIGS. 5A-5D, the light sources 520 are light emitting diodes that are on the interior surface 515 of the light collection cavity 510, in an example embodiment, but they are ports through which fiber-optic cables communicate light in another example embodiment. In other words, it is possible to use a light emitting diode (LED) within the light collection cavity 510 as a light source 520, and it is also possible to use a laser (i.e., coherent) source that is not within the light collection cavity 510, but whose light is led into the interior space 517 of the light collection cavity 510 via fiber-optic ports (which would constitute the light source 520 in this example).

Likewise, light sensors 530 in an example embodiment are disposed within the interior space 517 of the light collection cavity 510 by being placed or formed upon the interior surface 515 thereof. Similarly, in another example embodiment, the light sensors 530 are not located within the interior space 517 of the light collection cavity 510, and the light received is drained through fiber-optic ports (530), which route the light to the actual light sensors 530. It will be assumed for the examples described below that LEDs comprise the light sources 520 and light sensors 530 are installed within the interior of the light collection cavity.

Figure 6A:
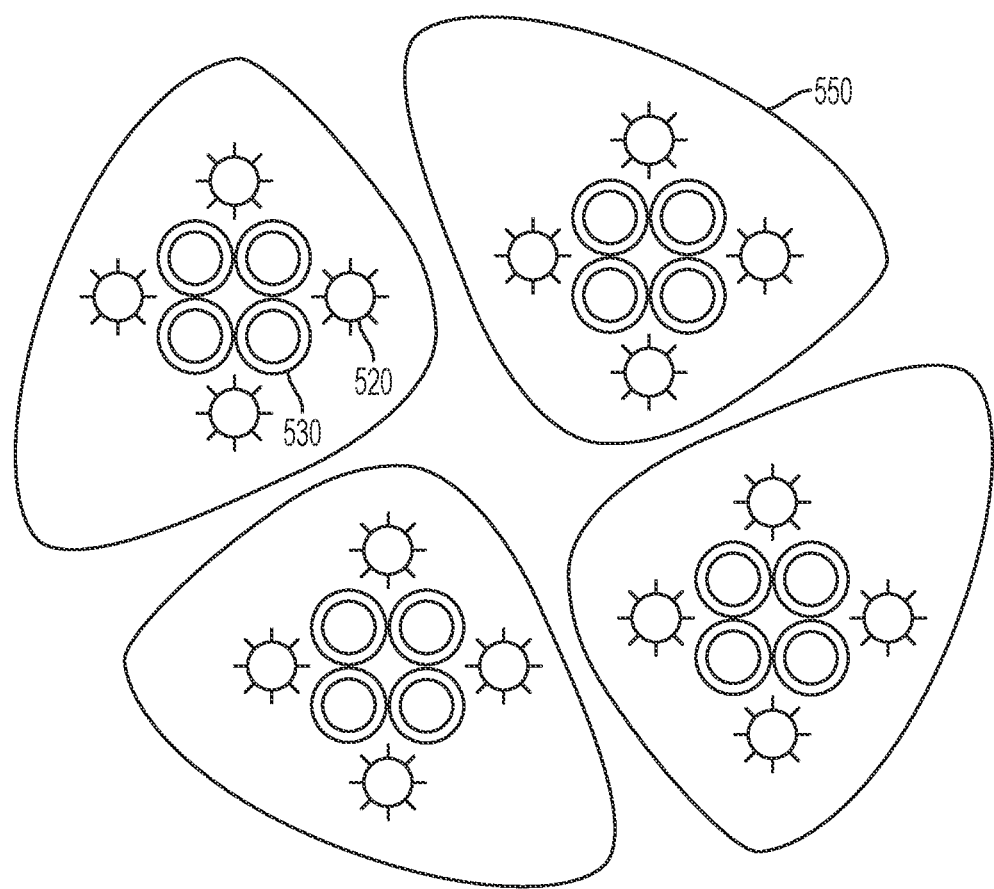
FIG. 6A shows an arrangement of light filters suitable for use in connection with the arrangements of FIGS. 4A and 5A.
Figure 6B:
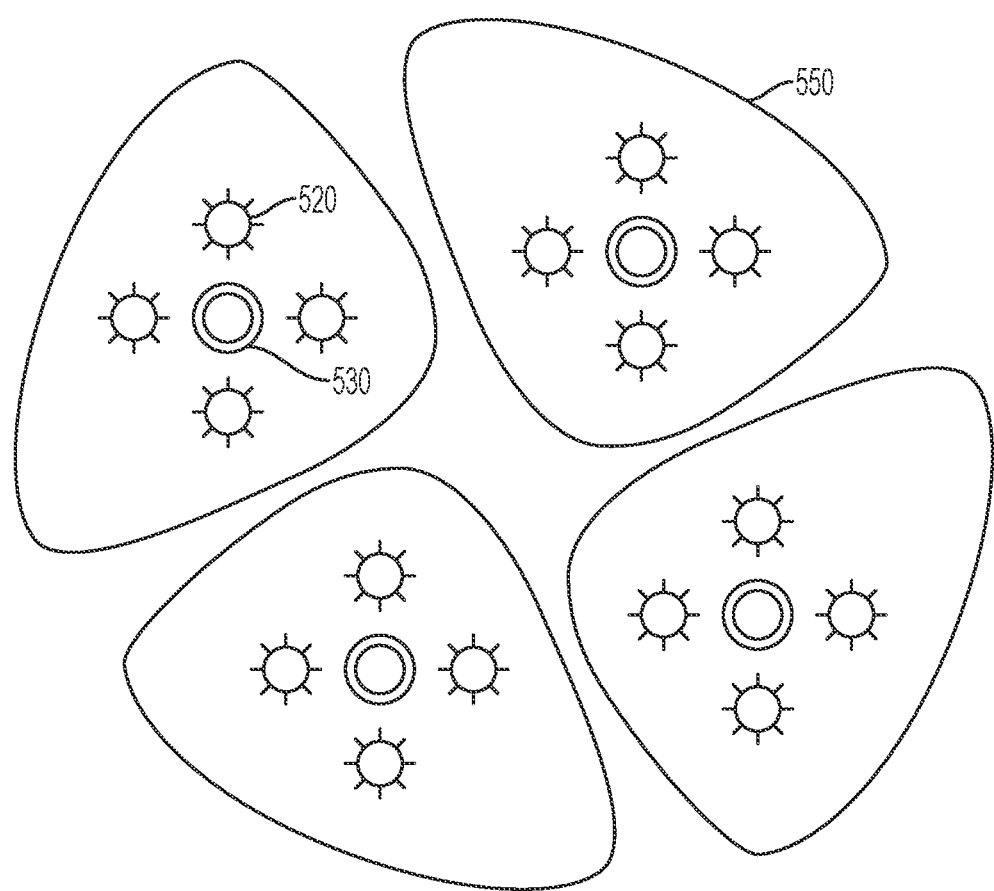
FIG. 6B shows an arrangement of light filters suitable for use in connection with the arrangements of FIGS. 4B and 5B.
Figure 6C:
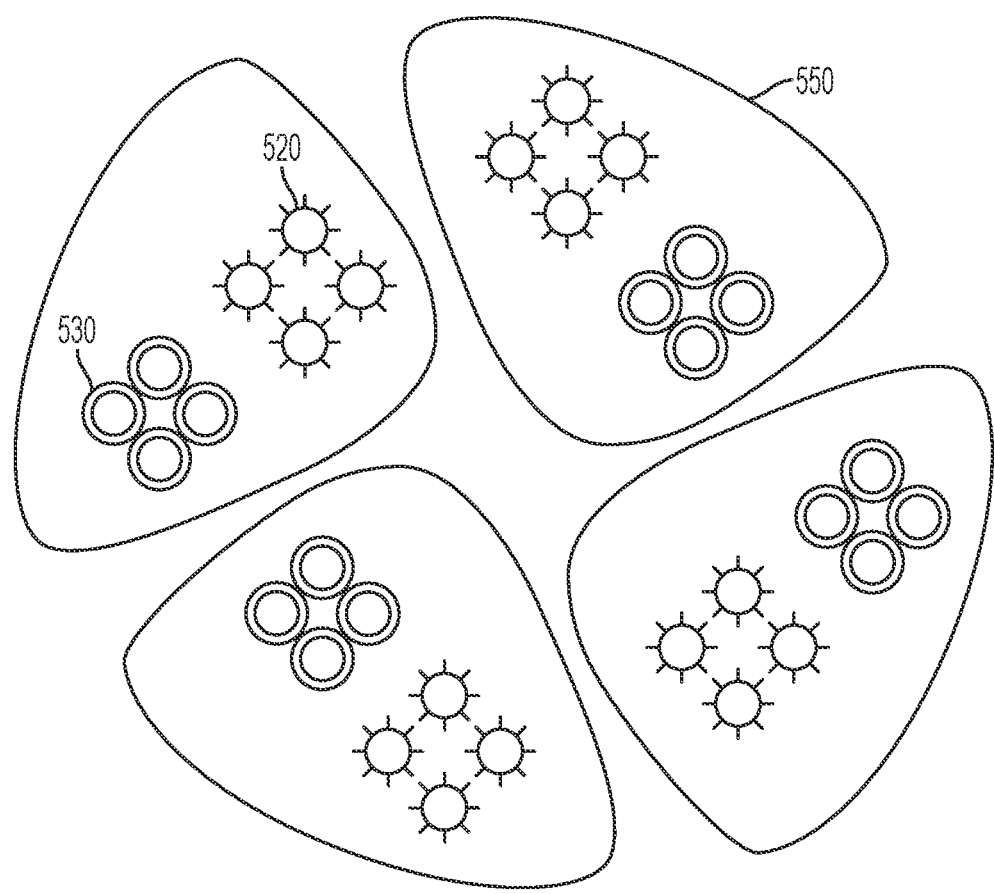
FIG. 6C shows an arrangement of light filters suitable for use in connection with the arrangements of FIGS. 4C and 5C.
Figure 6D:
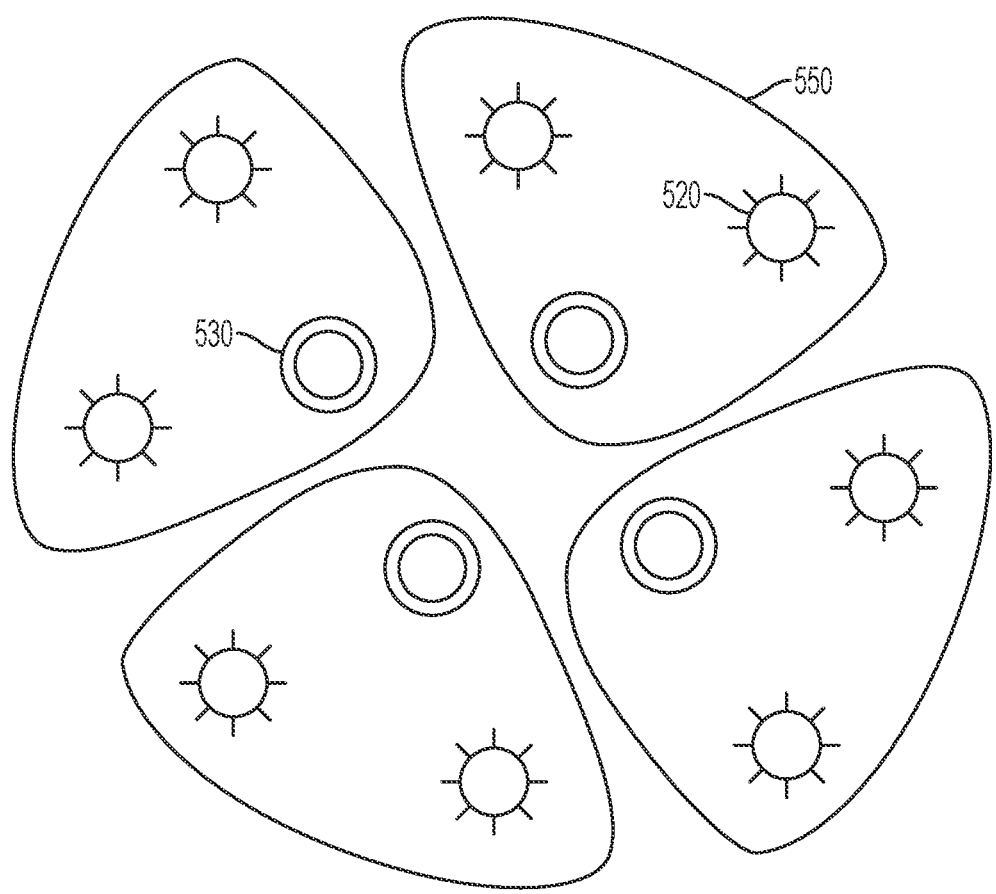
FIG. 6D shows an arrangement of light filters suitable for use in connection with the arrangements of FIGS. 4D and 5D.

FIGS. 6A, 6B, 6C, and 6D show examples of arrangements of light sources 520 and light sensors 530 as well as a filter 550 which is applied to both the light sources 520 and light sensors 530. In FIG. 6A, multiple patterns of the arrangement of FIG. 4A are provided. Each pattern is provided with a filter 550. In FIG. 6A, therefore, one or more of the light sources and one or more of the light sensors share a filter 550, according to an example embodiment. In another example embodiment, which is not illustrated, each light source 520 and light sensor 530 is configured with individual respective filters 550. Such an example embodiment is advantageous, for example, when light components are obtained or fabricated integrally with filter 550.

Applying the same filter 550 to multiple light sources 520 and light sensors 530 as shown in FIGS. 6A-6D reduces cost, increases accuracy, and simplifies the fabrication process. In other words, forming a single filter 550 over a light source 520 and a light sensor 530 ensures that both components are provided with a filter operating at the same wavelengths.

Filter 550 is configured to pass only wavelengths of light of the respective wavelength of each light computation component. If light sources 520 are realized via LEDs, the LEDs are formed in conjunction with a filter 550. Further, it is noted that filters 550 feature ranges around a center wavelength in which they will allow light to pass. The number of light sources and light sensors are selected depending on the particular implementation of the computing apparatus and in view of the computational resolution.

In FIGS. 4-6(A-D), the light sources 520 are shown in proximity to the light sensors 530. The light sources 520 output light which travels within the light collection cavity 510 and reflects from the interior surface 515, after passing through free space within the interior space 517 of the light collection cavity 510. In this arrangement, the sources and sensors are arranged so that enough of the light emitted by the sources is detected by the sensors after reflection from the interior surface 515 of the light collection cavity 510. In this arrangement, substantially none of the light, from the one or more light sources, travels directly to any of the light sensors.

In an alternative example embodiment, the sources and sensors are arranged so that light from the light sources 520 travels through free space directly to the light sensors 530. Providing the light sources and sensors close to each other provides for ease of implementation, wiring, and tuning the system. Example embodiments in which the light passes directly to the sensors require connections at two different points of the light collection cavity. It will be appreciated that even though filters 550 are installed as part of the light sources 520 and light sensors 530 in example embodiments, there is no need for other components within interior space 517 of light collection cavity 510. To put it another way, all of the interior space of the light collection cavity is free of interposed components according to various example embodiments. Filters 550 are not considered to be interposed components. Avoiding interposed components, such as components for focusing or redirecting light, has the advantage of simplicity of design and manufacture, and provides many advantages in terms of being able to miniaturize the calculation apparatus.

Figure 7:
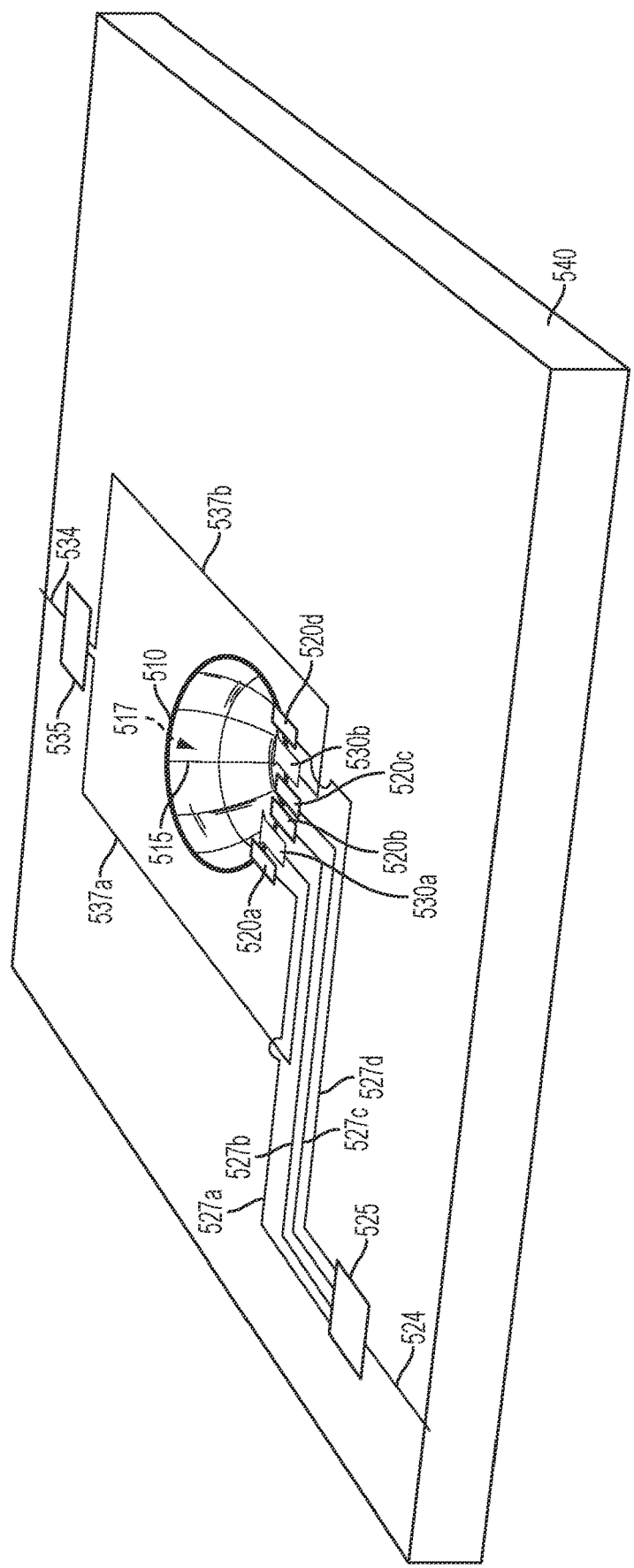
FIG. 7 shows a simplified schematic representing pre-calculation circuitry, calculation circuitry and post-calculation circuitry.

Turning now to FIG. 7, there is shown, in simplified schematic form, a single substrate 540 that includes the pre-calculation circuitry 300, the calculation circuitry 500, and the post-calculation circuitry 700.

In FIG. 7, the pre-calculation circuitry 300 and portions of the calculation circuitry 500 are represented by light source controller 525 which receives an input via line 524, which is a controller that controls the plurality of light sources (via paths 527a, 527b, 527c, and 527d) 520a, 520b, 520c, and 520d. The light that emanates from the plurality of light sources reflects off the interior surface 515 of the light collection cavity 510 and is sensed by sensors 530a and 520b. It should be noted that the number of light sources 520 and light sensors 530 may differ from the number represented in FIG. 7; FIG. 7 simply serves as an example of one basic configuration of the optical numerical computation device. The calculation circuitry 500 is represented at least by the light sources 520 and light sensors 530. These sensors further connect to the post-calculation circuitry 700, represented here as 535. The sensors 530 output electrical signals (voltages) that reflect an amount of light sensed by each sensor. These signals travel along signal conduits 537a and 537b to the remainder of the post-calculation circuitry 535. The representation of the calculation result is output via calculation result conduit 534.

Figure 10:
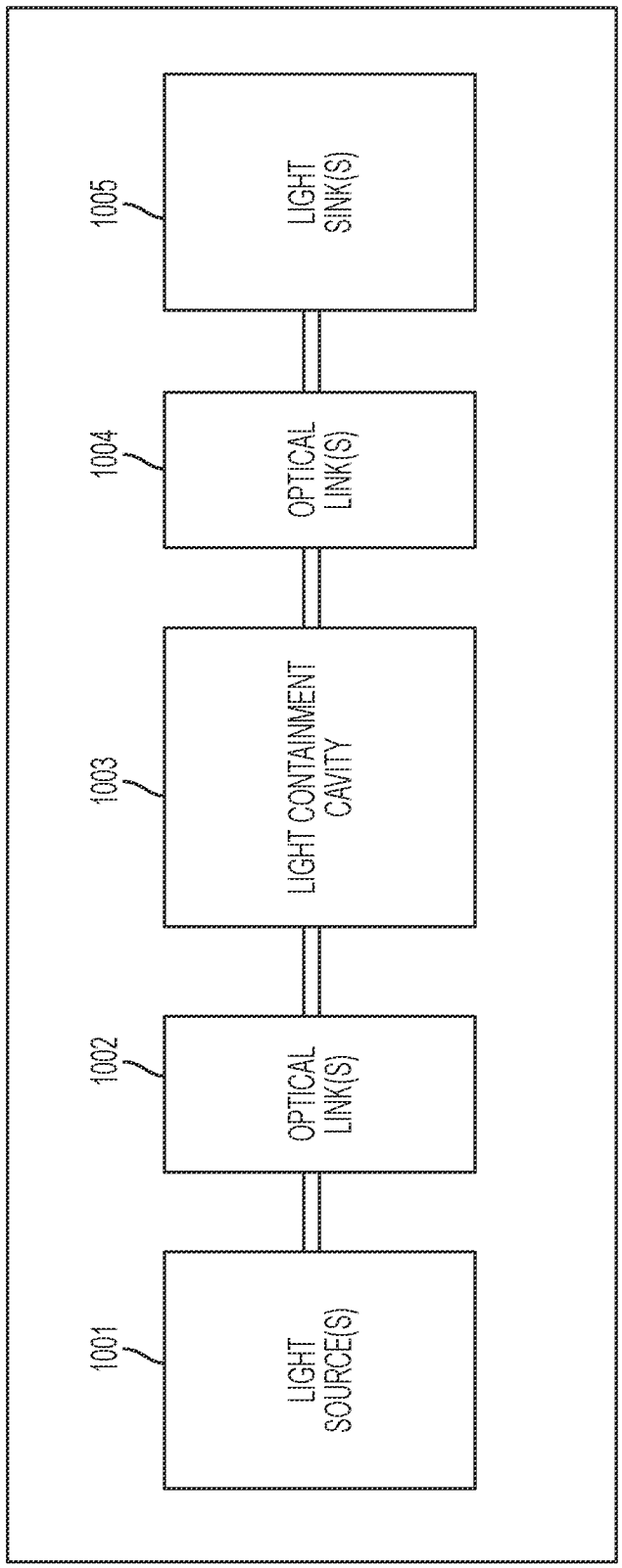
FIG. 10 shows an embodiment of the optical numerical computation device.
Figure 13:
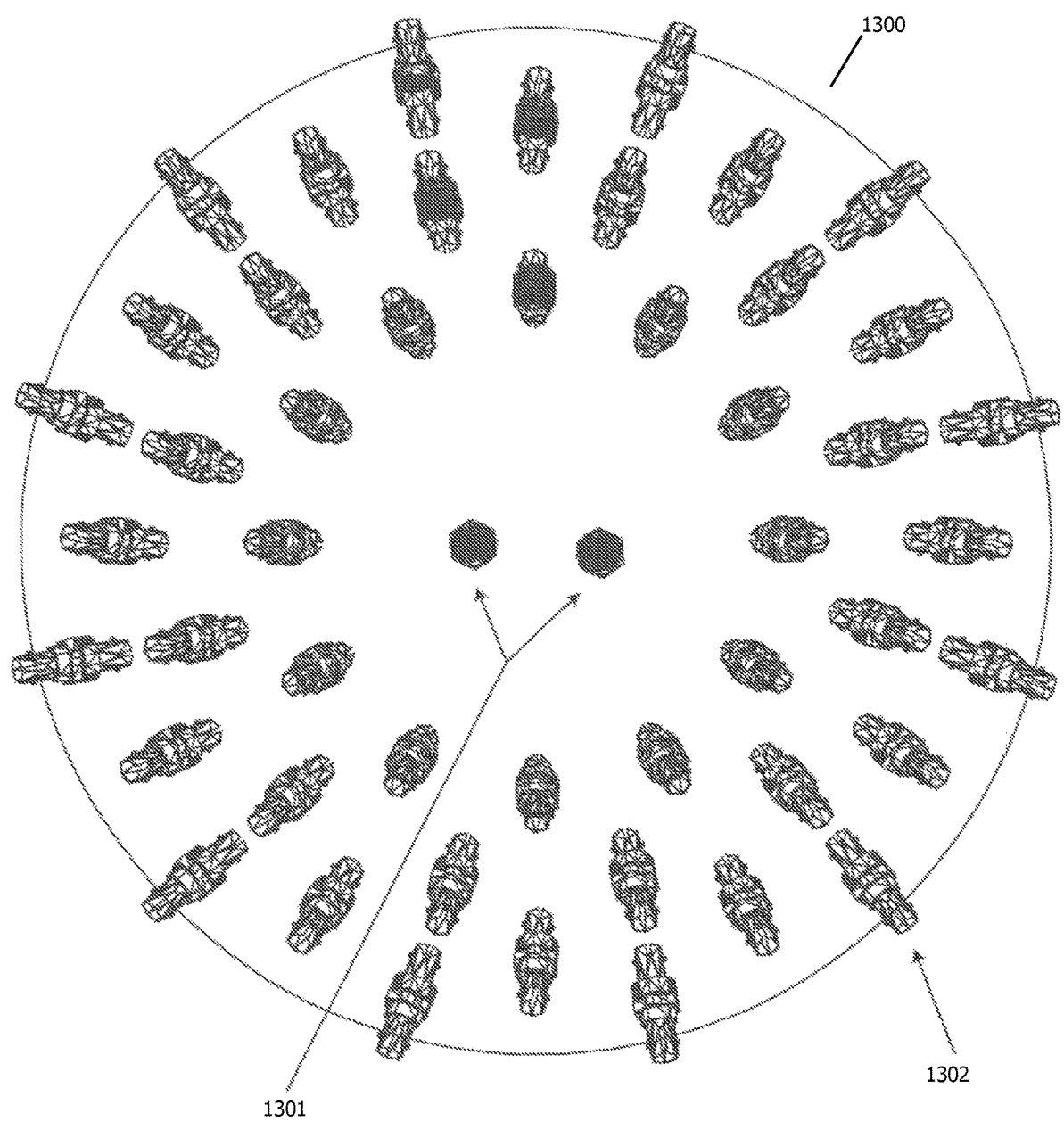
FIG. 13 shows a first view of an embodiment of a light collection cavity.
Figure 14:
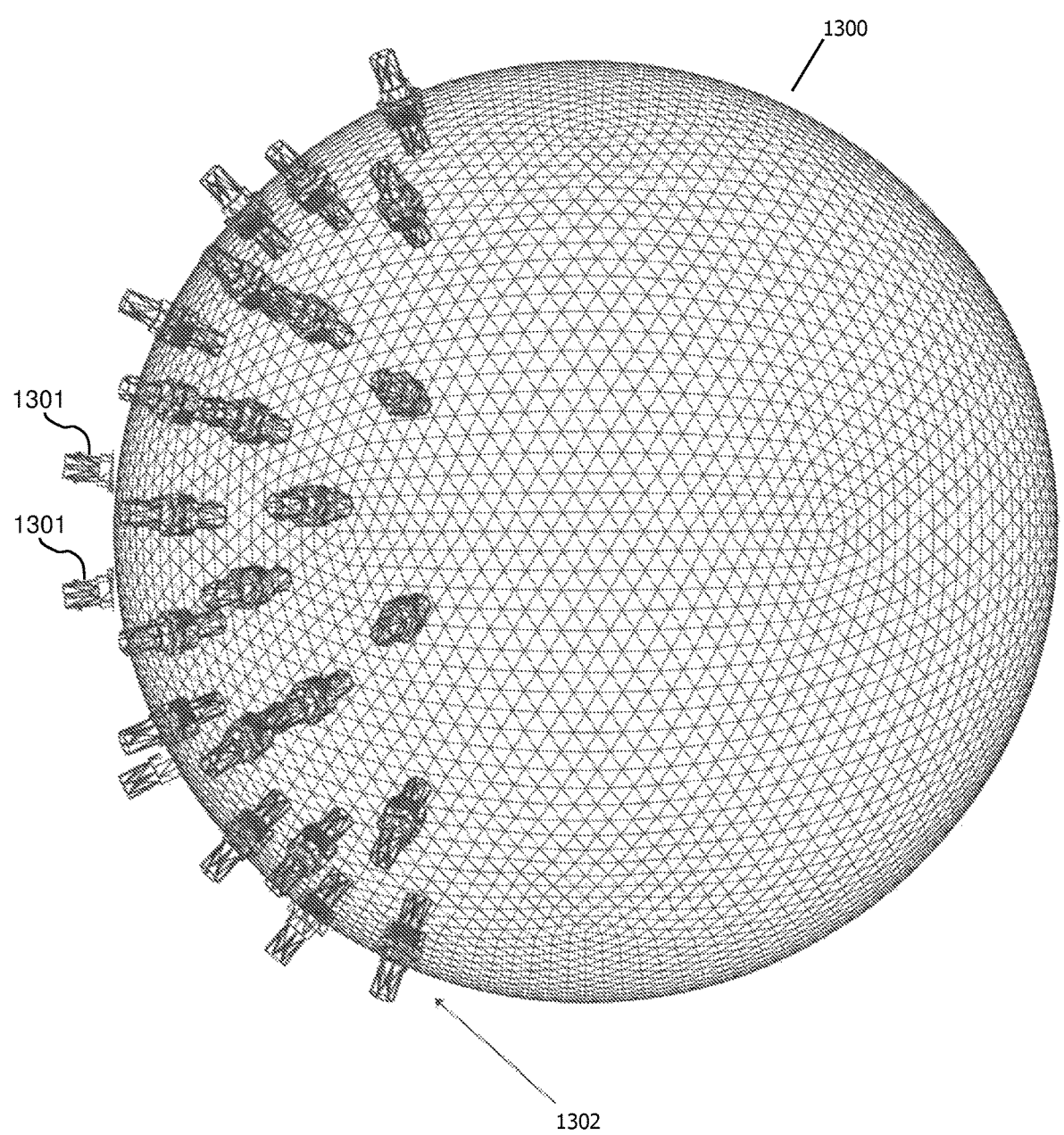
FIG. 14 shows a second view of the embodiment of the light collection cavity in FIG. 13.

FIGS. 10, 13, and 14 relate to an example embodiment in which light sources and sensors are not formed inside the light collection cavity but are, instead, communicated with the light collection cavity via optical links. In FIG. 10, the light sources 1001 and the light sinks 1005 are connected to a light containment cavity 1003 via a series of optical links 1004. FIG. 13 shows a three-dimensional representation of a top view of the exterior of a light collection cavity 1300 featuring connectors for light sensors 1301 ("light sinks") and connectors for light sources 1302. The connectors attach to optical links such as optical links 1004 shown in FIG. 10. FIG. 14 shows a three-dimensional representation of a side view of the exterior of light collection cavity 1300.

Figure 15:
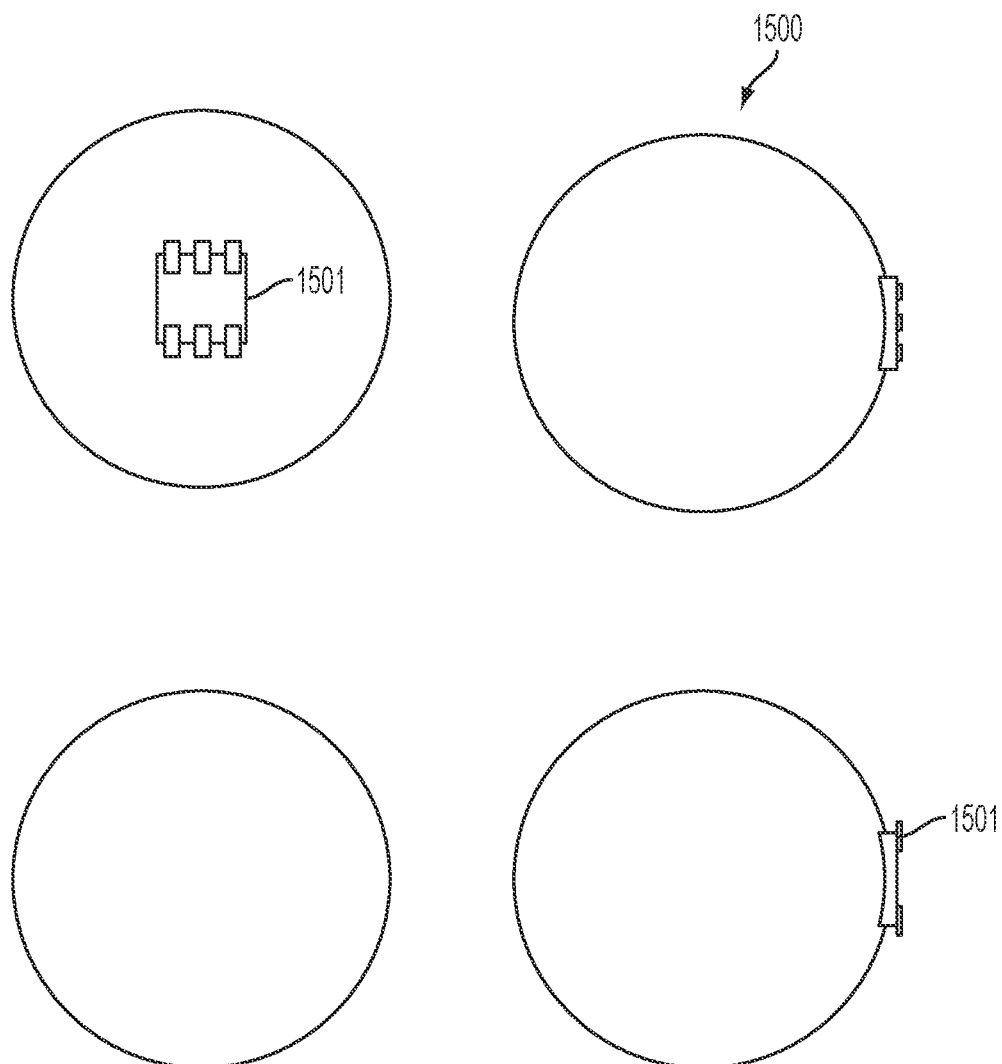
FIG. 15 shows a light sphere in which a light collection cavity is formed for SMD/SMT applications.
Figure 16:
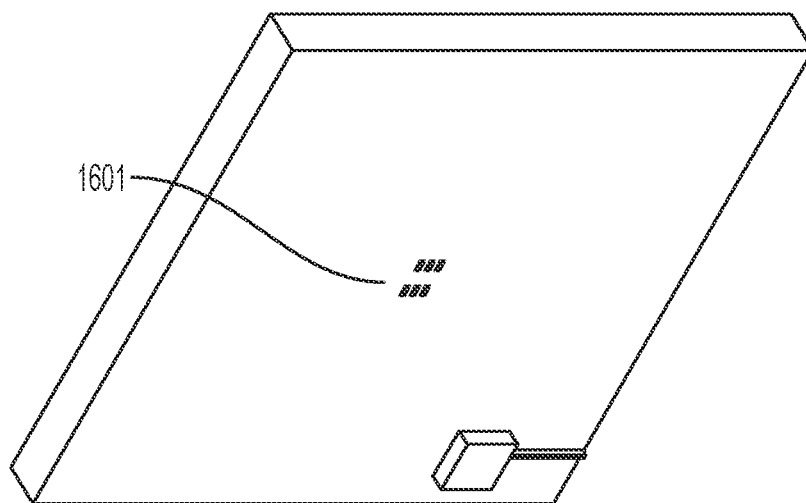
FIG. 16 shows a light sphere companion chip.
Figure 16:
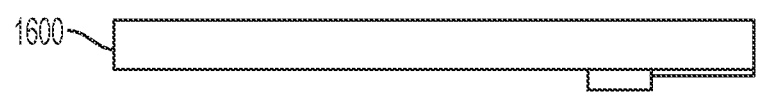
Figure 16:
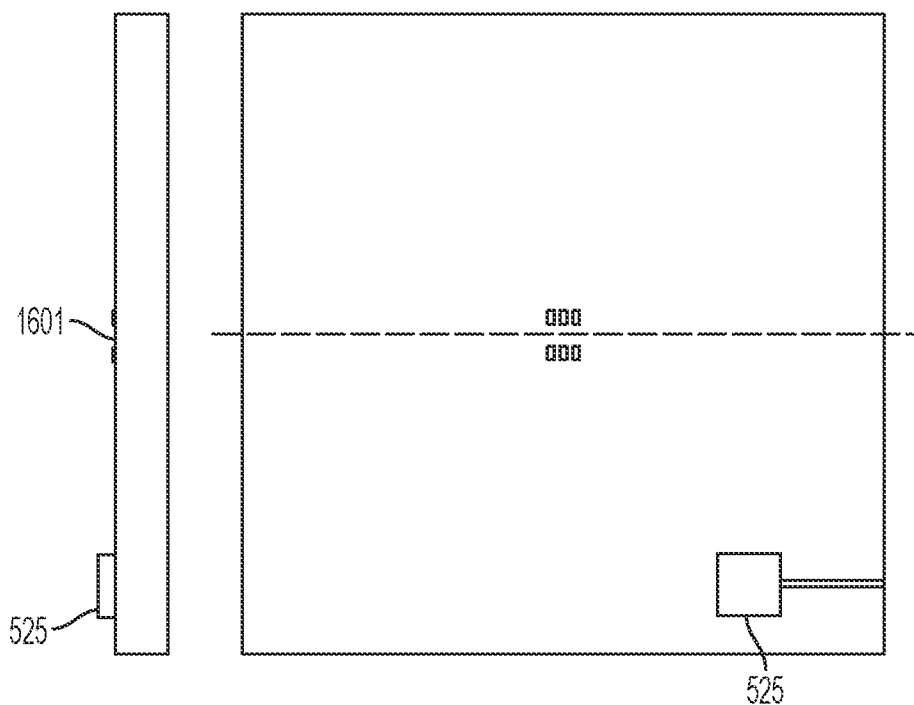
Figure 17:
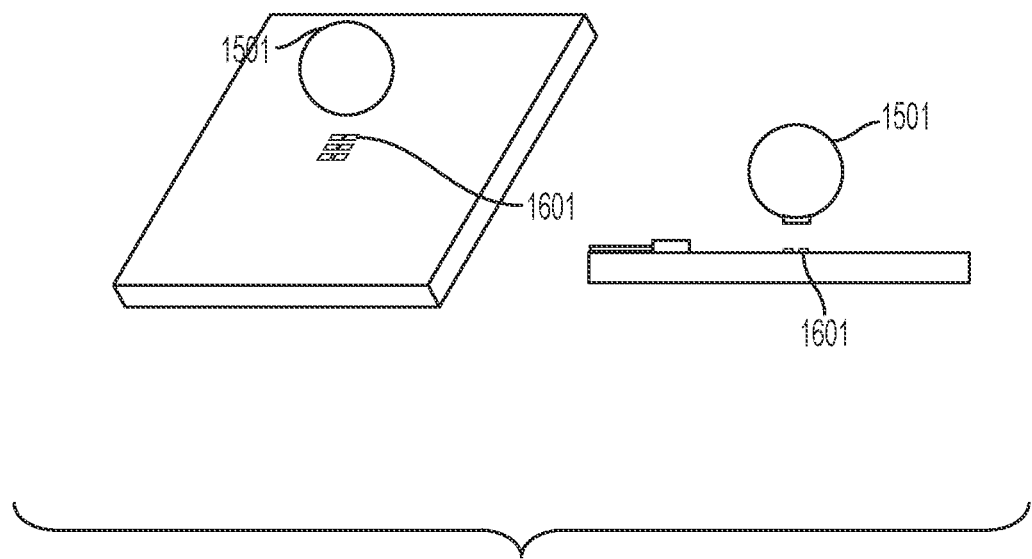
FIG. 17 shows a combination of a light sphere and a light sphere companion chip.
Figure 18A:
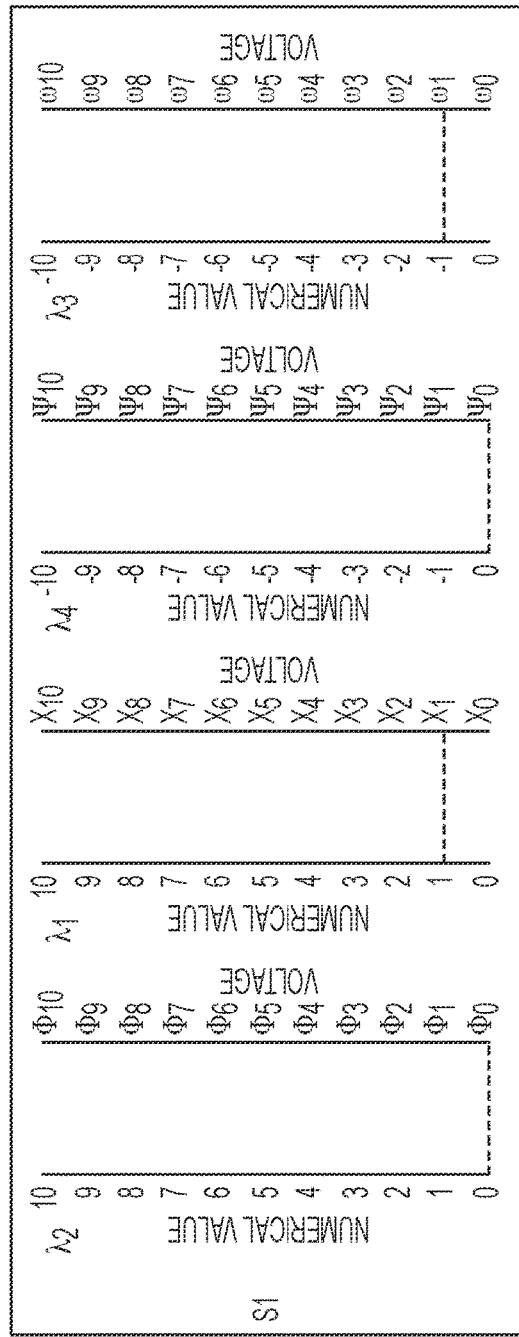
FIGS. 18A, 18B, 18C, and 18D show a logical progression of an example calculation via a plot of voltages across light sensors according to an example embodiment.
Figure 18B:
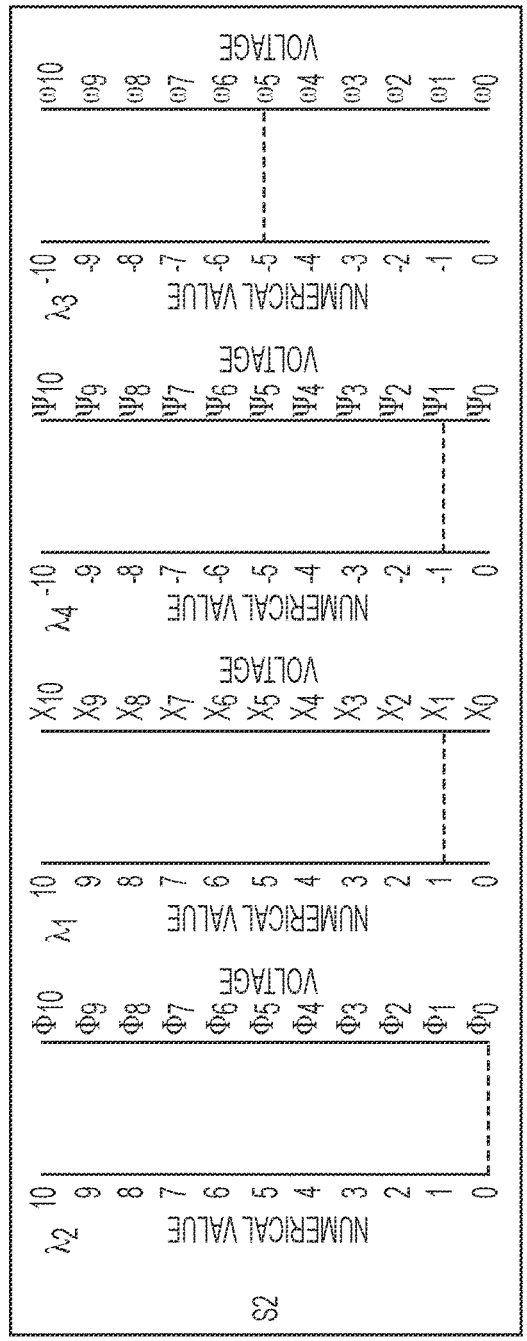
Figure 18C:
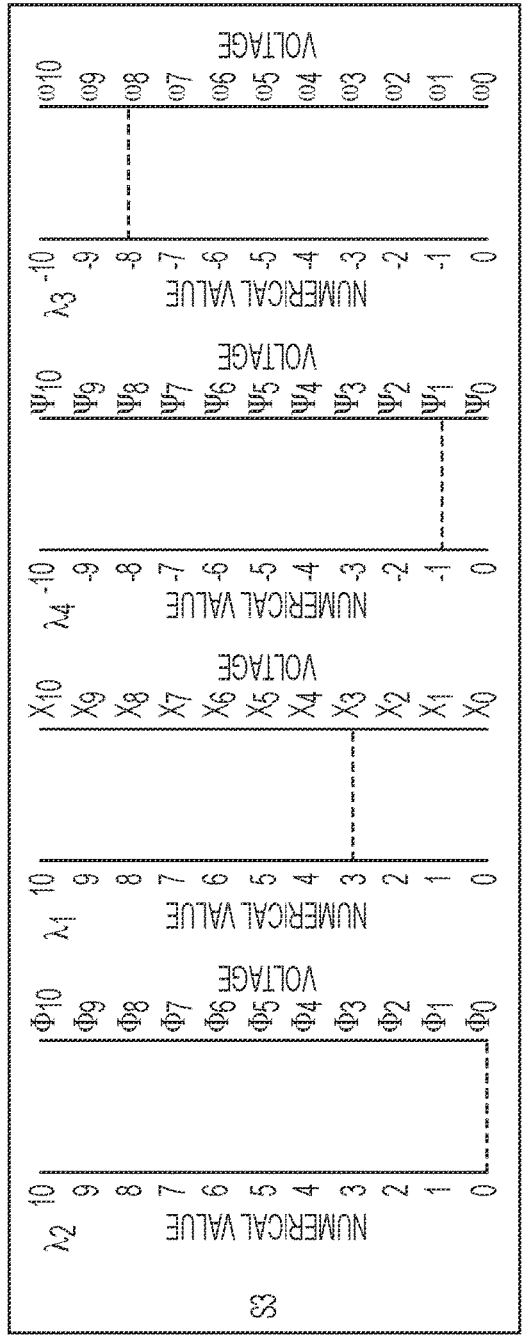
Figure 18D:
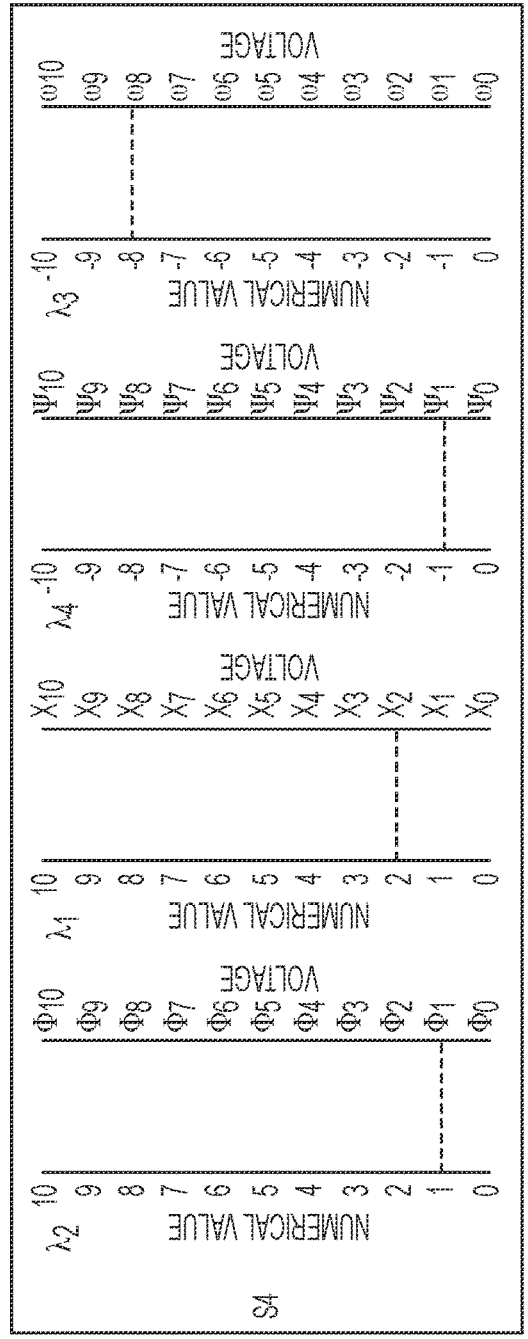

FIGS. 15-17 illustrate a concrete way a light collection cavity within a spherical housing is electrically connected with a circuit board via a light sphere companion chip. Turning first to FIG. 15, there is shown, in four views, a light sphere 1500 inside which a light collection cavity is formed. The light sphere 1500 has light sphere connector 1501 formed thereupon. The connection pads shown on connector 1501 are shown, for the sake of illustration only, as being six in number. The number of connectors will be determined by the particular implementation details. The light sphere 1500 represents an example embodiment in which the light components are formed on the surface of the interior of the light collection cavity, such as in the example embodiment depicted in FIG. 7. Thus, the connectors 1501 might be thought of as corresponding to connections to control the light components 520a, 520b, 520c, 520d, 530a and 530b as shown in FIG. 7.

The example embodiment shown in FIG. 7 may be thought of as an example of a light collection cavity formed from an actual cavity within an object, whereas the example embodiment shown in FIG. 15 may be thought of as an example of a light collection cavity formed from the creation, assembly, or manufacture of an object.

FIG. 16 shows light sphere companion chip or board 1600 with companion connectors 1601 formed thereupon. The companion connectors 1601 are formed so as to engage the connectors 1501. Also illustrated as an example component on companion chip or board 1600 is light source controller 525.

FIG. 17 shows a connection configuration between light sphere 1500 and light sphere companion chip or board 1600 such that the connectors 1501 and 1601 are aligned to facilitate connection.

Figure 11:
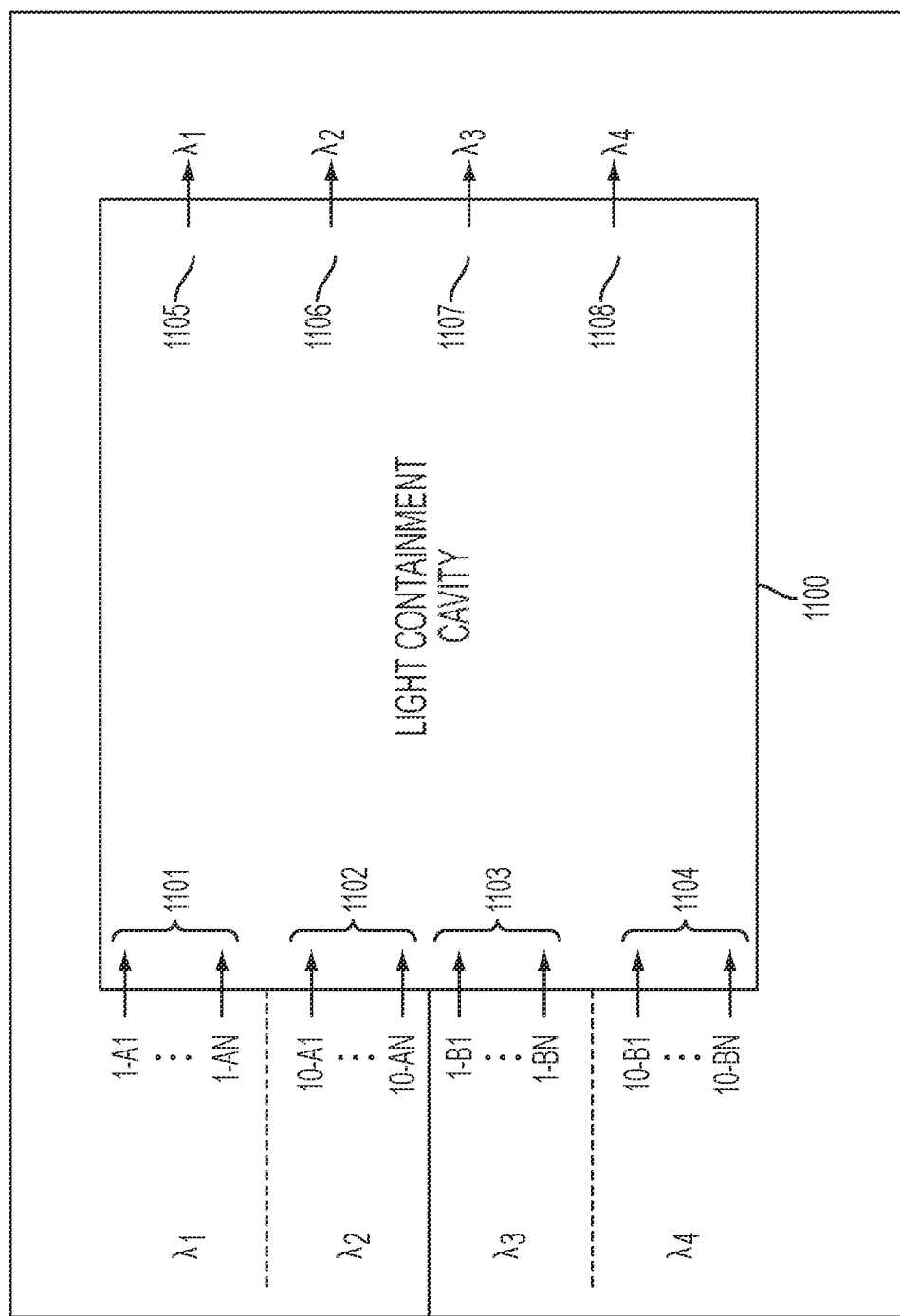
FIG. 11 shows a simplified representation of a light collection cavity according to an example embodiment.

FIG. 11 shows a simplified representation of a light collection cavity according to an example embodiment. Light collection cavity 1100 has least significant digit (LSD) type A inputs 1101, which are subdivided in FIG. 11 as inputs 1-A1 through 1-AN. The label "N" denotes that multiple sets of buffers may exist according to an example embodiment, wherein the number of operands to be inputted is limited only by the number of sets of buffers. LSD type A inputs 1101 correspond to a first wavelength ($\lambda_1$) of light produced by a light source. Similarly, most significant digit (MSD) type A inputs 1102 are subdivided into inputs 10-A1 through 10-AN. MSD type A inputs 1102 correspond to a second wavelength ($\lambda_2$). LSD type B inputs 1103 and MSD type B inputs 1104 are subdivided similarly to LSD type A inputs 1101 and MSD type A inputs 1102. LSD type B inputs 1103 and MSD type B inputs 1104 correspond to a third ($\lambda_3$) and fourth ($\lambda_4$) wavelength, respectively. According to an example embodiment, the "type" of input (i.e., type A or type B) determines the sign of a number represented by a given operand. In other embodiments, this type is used to represent other facets of a given operand. Light collection cavity 1100 also features $\lambda_1$ light sensor 1105, $\lambda_2$ light sensor 1106, $\lambda_3$ light sensor 1107, and $\lambda_4$ light sensor 1108.

Figure 12:
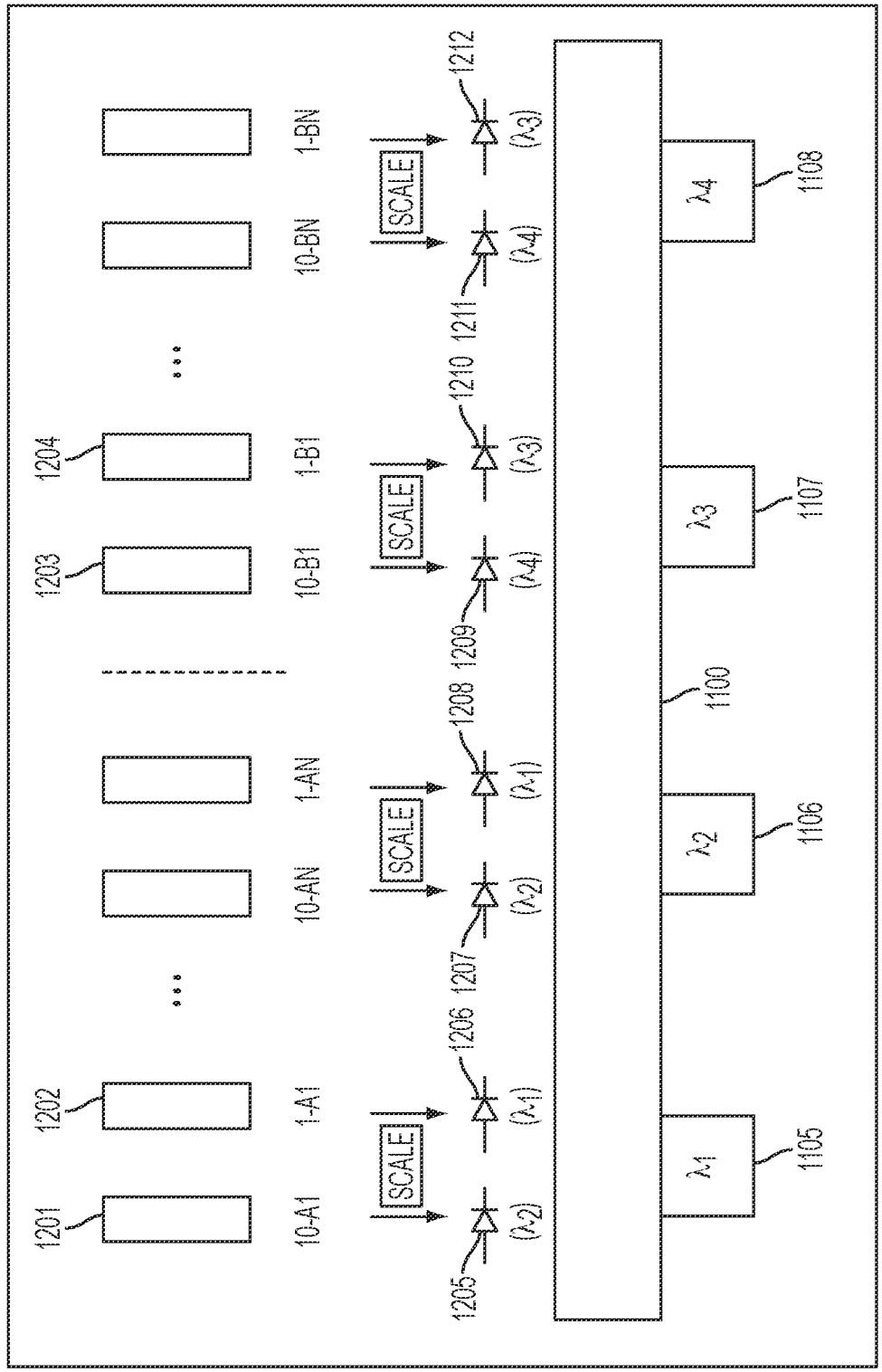
FIG. 12 shows a simplified representation of pre-calculation circuitry and calculation circuitry according to an example embodiment.

FIG. 12 shows a simplified schematic representation of pre-calculation circuitry and calculation circuitry according to an example embodiment. In FIG. 12 there are shown light collection cavity 1100, a plurality of buffers including MSD buffer 1 (type A) 1201, LSD buffer 2 (type A) 1202, MSD buffer 1 (type B) 1203, LSD buffer 2 (type B) 1204, a plurality of light sources including light sources 1205 and 1207 operating at $\lambda_2$, light source 1206 and 1208 operating at $\lambda_1$, light sources 1209 and 1211 operating at $\lambda_4$, light sources 1210 and 1212 operating at $\lambda_3$, and a plurality of light sensors including sensors 1105-1108 sensing light at frequencies $\lambda_1$-$\lambda_4$, respectively.

The buffers 1201-1204 are each capable of storing a single digit operand representing either the least or most significant digit of an inputted two-digit operand, or simply a single digit operand. In addition, further buffers (for example, 10-AN and 1-AN) may be included for the purpose of inputting more operands. Further, each buffer in FIG. 12 corresponds to a light source, the wavelength of which is predetermined (i.e., MSD buffer 1 (type B) 1203 corresponds to MSD light source 1 (type B) 1209). The light sources in FIG. 12 emit light to light collection cavity 1100, the light being sensed by a respective light sensor from among $\lambda_1$ light sensor 1105 (a first LSD light sensor), $\lambda_2$ light sensor 1106 (a first MSD light sensor), $\lambda_3$ light sensor 1107 (a second LSD light sensor), and $\lambda_4$ light sensor 1108 (a second MSD light sensor). Within the light collection cavity 1100, the light components are arranged according to any of the example embodiments previously discussed.

An example calculation seeking an arithmetic solution according to an example embodiment will now be described with reference to FIGS. 11, 12, and 18A-18D. In FIGS. 18A-18D, a series of graphs are shown which represent the voltage across the light sensors of light collection cavity 1100. These graphs are shown as a logical progression as operands are injected into light collection cavity 1100. The actual speed of calculation is limited only by the speed at which input circuitry 100 (FIG. 1) receives input. Input circuitry 100 accepts input and outputs an indication of operands of the numerical operation to be performed to pre-calculation circuitry 300. Within pre-calculation circuitry 300, operands are inserted into buffers according to a predetermined sequence (discussed below) and are emitted via light sources to calculation circuitry 500 (i.e., light collection cavity 1100).

Herein a sample arithmetic operation of 1+12−15−3 (base 10) is used as an example to help disclose the implementation of a concrete embodiment. In step S1 (FIG. 18A), it is assumed for the sake of brevity that two operands may be inputted simultaneously as long as they are of different types (type A/B). Other example embodiments accept the input of one operand at a time. Although the buffers mentioned above are labeled as type A or type B, buffers according to an example embodiment are not predefined as a given type. The type of the buffer is determined purely based on the sign of the operand to be input to the light collection cavity 1100; they are merely pre-labeled here for the sake of clarity.

A value 1 is inputted to LSD buffer 1 (type A) 1202, as part of inputting the operand "1". A value of −1 is inputted to LSD buffer 1 (type B) 1204, as part of inputting the operand "−15". These two operands are the most significant digits of their respective operands (1 and −15). As a result, buffers 1202 and 1204 drive light sources 1206 and 1210 respectively to output corresponding light at respective wavelengths; these are respectively detected by $\lambda_1$ light sensor 1105 and $\lambda_3$ light sensor 1108. As these two values are of different signs, they are output at different wavelengths.

In step S2 (FIG. 18B), input of the first operand 1 is complete, no further action is necessary to represent this operand. However, operand −15 needs to have its least significant digit input. Accordingly, the previously input value −1 is shifted to MSD buffer 1 (type B) 1203 in order to free up LSD buffer 1 (type B) 1204. The value −5 is accordingly inputted to LSD buffer 1 (type B) 1204. At this point, two complete operands have been inputted, and corresponding light is sensed by corresponding light sensors.

Similarly, in step S3 (FIG. 18C), the most significant digits of the next two operands are input to another set of buffers (i.e., 10-AN, 1-AN and 10-BN, 1-BN). In the case of the second positive operand 12, the most significant digit 1 is inputted to buffer 1-AN, and in the case of the second negative operand −3, the most significant digit −3 is inputted to buffer 1-BN. The sensed voltage across $\lambda_1$ and $\lambda_3$ accordingly become x3 and ω8.

In step S4 (FIG. 18D), input of the operand −3 is complete, but operand 12 needs to have its least significant digit inputted. Accordingly, the previously inputted value 1 is shifted to buffer 10-AN in order to free up buffer 1-AN. The value 2 is accordingly inputted to buffer 1-AN, and input of the operands is completed. Reacting to the values stored in the various buffers, light sources 1205-1212 are driven at appropriately scaled voltages in order to output light. It should be noted that MSD light source 1 (type A) 1205 and MSD light source 2 (type A) 1207 output light at the same wavelength. Similar relationships exist between the other light sources based on their type and digit significance. As light is emitted at the same wavelength from multiple light sources, that light is cumulatively sensed by a corresponding light sensor (i.e., the light emitted by LSD light source 1 (type A) 1206 and LSD light source 2 (type A) 1208 is sensed by $\lambda_1$ light sensor 1105 as an LSD sum and the light emitted by MSD light source 1 (type A) 1205 and MSD light source 2 (type A) 1207 is sensed by $\lambda_2$ light sensor 1106 as an MSD sum). In this way, the light collection cavity 1100 is able to produce resultant outputs from each of the light sensors representing the sum of each category of inputted digit (i.e., ten's place type A inputs, one's place type B inputs, etc.) in the form of an output voltage (denoted as $\phi$, x, $\psi$, and ω in FIG. 18).

The light sensors of light collection cavity 1100 are each connected to post-calculation circuitry 700 which is configured to determine a calculation result. The calculation result is proportionally related to the arithmetic solution. Post-calculation circuitry 700 accomplishes this by determining the voltage across each light sensor and scaling each value according to the type of input. The type of input may be defined, for instance, based on a predetermined range of voltages. For example, values between 0 and 2.5 volts may be considered type B values (i.e., negative values), whereas values between 2.5 and 5 volts may be considered type A values (i.e., positive values).

This delineation of ranges is predetermined and is adhered to by both the calculation circuitry 500 and the post-calculation circuitry 700. After determining the type of input, post-calculation circuitry 700 inverts the voltage of any and all type B inputs as they represent negative values. This inversion serves to allow for a voltage combination in order to determine a calculation result related to the input operands. Post-calculation circuitry 700 further scales the voltages produced by each light sensor, and the voltages are appropriately proportioned for combination. That is to say, the voltages across $\lambda_1$ light sensor 1105 and $\lambda_3$ light sensor 1107 are scaled to be, for example, an order of magnitude smaller than those across $\lambda_2$ light sensor 1106 and $\lambda_4$ light sensor 1108 to match the numerical relationship between the values represented thereby. After scaling each voltage, post-calculation circuitry 700 performs voltage addition to determine a single output representation. This representation is then matched to a numerical value, and output circuitry 900 outputs a calculation result based thereupon via display or digital interface.

To put it another way, and referring back to FIG. 12, the buffers with a "10-" prefix relate in this example to the "tens place" (the MSD in this two-digit example) in base 10 arithmetic (that is, a numbering system that has a base b where b=10; the buffers with a "1-" prefix relate in this example to the "one's place" (the LSD) in base 10 (base b=10) arithmetic. The type "A" buffers relate to positive numbers, and the type "B" buffers relate to negative numbers, in this example. Because the digits in the tens place for all positive numbers (10-A1 and 10-AN) are represented by light amplitudes from light sources (1205 outputting respective third light and 1207 outputting respective fourth light) having the same wavelength ($\lambda_2$) in this example, the light sensed at the corresponding sensor (1106 for $\lambda_2$) represents a sum of the amplitudes of light emitted from those light sources for all the digits in all of the tens places (i.e., the respective most significant digit) of all the operands that are positive numbers.

Likewise, the digits in the one's place (the LSD) for all operands that are positive numbers (1-A1 and 1-AN) are represented by light amplitudes from first through n-th LSD light sources (1206 outputting respective first light and 1208 outputting respective second light) having the same wavelength ($\lambda_1$, a first wavelength) in this example, the light sensed at the corresponding sensor (1105 for $\lambda_1$) represents a sum of the amplitudes of light emitted from those light sources for all the digits in all of the ones places (i.e., the respective least significant digit) of all the operands that are positive numbers.

Similarly, the light sensor 1108 for $\lambda_4$ senses and sums the amplitudes of light emitted from the light sources for all the digits in all of the ten's places of all the negative numbers, and light sensor 1107 for $\lambda_3$ does the same for the digits in the one's places for the negative numbers.

In FIG. 12, the ellipsis between the buffers (10-A1, 1-A1) and (10-AN, 1-AN) indicate that, although only two two-digit positive numbers are drawn, additional buffers are implemented in other example embodiments so as to add together in a single operation as many two-digit positive numbers as are desired. The same is true for negative numbers.

In FIG. 12, the use of two-digit numbers is illustrated, but three-digit numbers, four-digit numbers, etc., are implemented in like manner by simply adding additional buffers, additional light sources operating at wavelengths distinct from those used for other digits, and additional light sensors to sum the light for the particular wavelengths.

The example presented above is presented in the familiar base 10. For example, FIGS. 18A-18D show a correspondence between various voltages and numerical values such that, for $\lambda_1$, a voltage of x0 corresponds to a numerical value of 0 in base 10, and a voltage of x8 corresponds to a numerical value of 8, and so on. To state the same information more generally, each operand is a representation of a numerical value (such as operands 1, 12, −15, and −3 mentioned above) in a numbering system that has a base b and represents numerical values of operands using n digits in n respective positions. For example, the operands 1 and −3 have one digit each (n=1) and the operands 12 and −15 have two digits each (n=2) where n is an integer and n≥1 (the numbering system uses at least one digit to represent an operand and sometimes more).

The n digits of an operand may be individually discussed herein using an index i where the least significant digit is $d_0$ and a most significant digit is $d_{n-1}$ and where the index i ranges from 0 to one less than however many digits the operand has (i.e., 0≤i<n). For example, in the operand 12, the least significant digit "2" is digit $d_0$ and the most significant digit "1" is digit $d_1$. This operand "12" has two digits (n=2), so 0≤i<2 describes the range of values that i can take on. The respective position $p_i$ of each digit may also be individually discussed using the same index so that the least significant digit $d_0$ is in the respective position $p_0$, and the most significant digit $d_{n-1}$ is in the respective position $p_{n-1}$, and the position of any given digit $d_i$ is $p_i$. Similarly, the respective value $v_i$ indicates the value of any given digit $d_i$ using the same index. In the numbering system, each digit $d_i$ has a respective value $v_i$ that can have values in the range of 0 up to one less than the base. For base 10, the values can be from 0 to 9. For an arbitrary base b the respective value $v_i$ is in the range 0≤v≤(b−1). Now, the position $p_i$ of a given digit indicates a position-dependent multiplier of the value $v_i$, namely, ($b^i$). The position $p_i$ also relates to a respective order of magnitude. The respective order of magnitude is therefore based on $b_i$. The i-th digit $d_i$ in position $p_i$ represents a numerical value of $v_i(b^i)$. For example, the "one's place" for base 10 (b=10) is the least significant digit $d_0$ and is in the zeroth position ($p_0$). The value $v_0$ represents a numerical value where $v_0$ is multiplied by the base 10 raised to the zeroth power $v_0(10^0)$. In the "tens place" the value $v_i$ is multiplied by the base 10 raised to the first power $v_1(10^1)$. The operand 12 in base 10 (b=10) has n=2 digits ($d_1$ and $d_0$). Digit $d_1$ in position $p_1$ has a value $v_1$=1 and digit $d_0$ in position $p_2$ has a value $v_0$=2. The numerical value of $d_1$ (i.e., the digit in the i-th position where i=1) is $v_1(b^1)$=1($10_1$)=10. The numerical value of $d_0$ is $v_0(b^0)$=2($10^0$)=2. The digits of the operand, accounting for their respective positions, represent the numerical value twelve. Note that a given digit differs from its adjacent digit or digits (i.e., the digits that have positions that are one greater or lesser than the position p of the given digit) by an order of magnitude due to the position-dependent multiplier.

Although the example presented above involves base 10, other example embodiments use bases other than base 10. That is to say, in another example embodiment, the base is actually implemented as base 100 (b=100). In that embodiment, the light sources are each controllable to emit light at any of at least 100 different amplitudes, and each sensor is able to discriminate at least 100 different light amplitude values. Therefore, the least significant digit (in position $p_0$) can represent numerical values ranging from 0×$100^0$ to 99×$100^0$ (i.e., 0 to 99) and the adjacent digit $d_1$ in position $p_1$ can represent numerical values ranging from 0×$100^1$ to 99×$100^1$ (i.e., 0 to 9900), giving a range of 10,000 different numeric values represented only two digits.

In yet another example embodiment, the light sources have an amplitude output range of 0 W to 5 W, controllable in increments of 1 nW. In this example embodiment, the light sensors can accurately discriminate light amplitudes differing by 1 µW within the range of 0 W-5 W. Individual numeric values are set every 10 µW, for example, to avoid computational errors.

According to this example embodiment, there are 100,000 possible numeric values within each 1 W of output, giving a total of 500,000 different numeric values for each digit. In this circumstance, a base of 500,000 (b=500,000) may be used. Therefore, the least significant digit (in position $p_0$) can represent numerical values ranging from 0×$500000^0$ to 499999×$500000^0$ and the adjacent digit $d_i$ in position $p_1$ can represent numerical values ranging from 0×$500000^1$ to 499999×$500000^1$, giving the capability of representing 250 billion different values in only two digits.

In an alternative example embodiment, based on the immediately preceding example with base b=500,000, a midrange value of 2.5 W is selected as numeric zero, thereby splitting the number of possible values into 125 billion positive numbers and 125 billion negative numbers which may be represented in two digits.

The use of bases beyond 16 is seldom seen because it is necessary to define a unique symbol for each different value if writing the number. According to the example embodiments mentioned above, the value is represented in terms of light amplitude and sensed wattage, so there is no need to write a symbol in, e.g., base 100 or base 500,000. The conversion to a decimal (b=10) or binary (b=2) number is handled by the post-calculation or output circuitry. Since conversion between bases is a well-known operation, it is not discussed further herein.

While any of the light sensors discussed herein can be realized by conventional means (i.e., a photodetector, photo-resistor, photodiode, etc.), they can also be realized via metamaterial-based sensors, optical nano-antennas ("nantennas"), or other emerging sensing technologies.

Figure 8A:
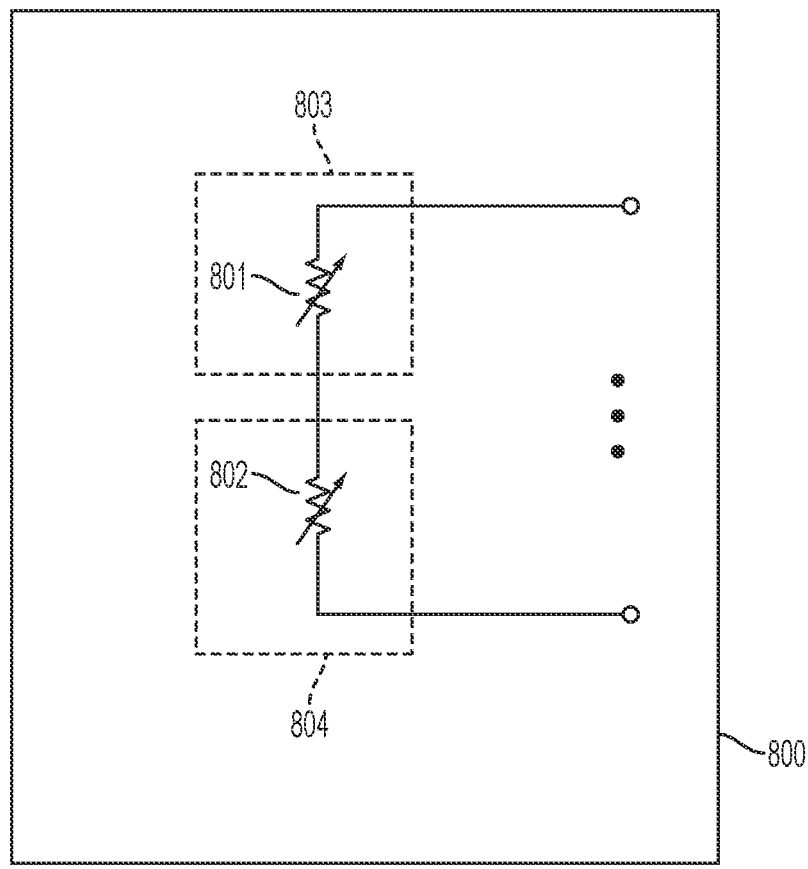
FIG. 8A shows a simplified schematic representing an arrangement of light sensors according to an example embodiment.
Figure 8B:
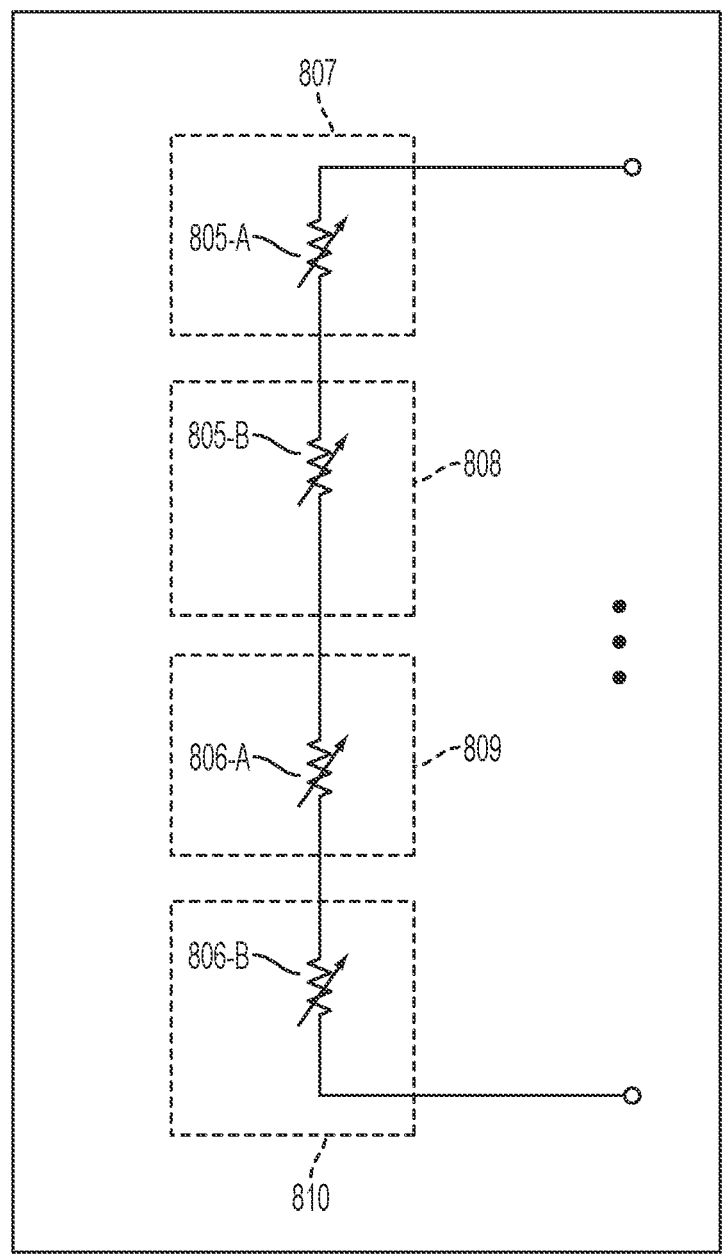
FIG. 8B shows a simplified schematic representing another arrangement of light sensors according to an example embodiment.

According to another example embodiment of the optical numerical computation apparatus, a visible light sensor is configured in series with an infrared photodiode. This example embodiment is comprised of components similar to those discussed above but, as mentioned, with the light sensors in series, as shown in FIGS. 8A and 8B.

A filter, configured in conjunction with the visible light sensor, filters out nonvisible wavelengths before they reach the visible light sensor. The same or a similar filter is applied to an LED or other light source which produces visible light. The visible light sensor (photo-resistor) detects visible wavelengths (315 nm-710 nm). The resistance of the visible light sensor decreases as the amplitude of light incident upon it increases. That is to say, the visible light sensor is in a high impedance state when no visible light is incident upon it.

A second filter, configured in conjunction with the infrared light sensor, filters out all non-infrared wavelengths of light before they reach the infrared light sensor. The same or a similar filter is applied to an LED or other light source which produces infrared light (i.e., it results in an infrared light source). In this way, infrared light does not influence the visible light sensor, and visible light does not influence the infrared light sensor. That is to say, when infrared light is introduced into the system, the resistance of the visible light sensor (and thus the voltage across it) does not change. The aforementioned second filter configured in conjunction with the infrared light sensor of the present embodiment allows only infrared wavelengths of approximately 850 nm to 2500 nm to pass to the infrared light sensor. The infrared light sensor, which is otherwise in a low-resistance state, increases in resistance as infrared light becomes incident upon it.

As the infrared light sensor increases in resistance, the voltage across it and the visible light sensor (as they are in series) is accordingly limited. This feature enables a subtraction calculation.

FIG. 8A of the instant application is an electrically representative view of one embodiment of light amplitude sensing circuit 800, showing visible light sensor 801, infrared light sensor 802, visible light filter 803, and infrared light filter 804. Further elements connect to these components in order determine the total resistance of visible light sensor 801 and infrared light sensor 802.

FIG. 8B is like FIG. 8A but provides for sensing two digits, i.e., a "one's" place (805-A and 806-A) and a "ten's" place (805-B and 806-B). The sensors with the "-B" suffix are tuned so that their respective values are an appropriate order of magnitude greater than the sensors with the "-A" suffix. Filters 807-810 are dedicated so as to pass specific respective portions of the visible or infrared spectrums.

A subtraction calculation in this example embodiment is accomplished in the context of FIG. 8A by considering the total resistance of visible light sensor 801 and infrared light sensor 802 in the presence of either or both of visible light and infrared light. In this embodiment, positive numerical values are represented by the visible light spectrum (315 nm-710 nm). Thus, in this embodiment, visible light sensor 801 serves as a positive number value sensor. Similarly, negative numerical values are represented by the infrared spectrum, more specifically the near-infrared spectrum (800 nm-2500 nm). Thus, in this embodiment, infrared light sensor 802 serves as a negative number value sensor.

As a basic example calculation of 15−63=−48 in this example embodiment, a positive numerical operand 15 is associated with visible light of a specific amplitude. The aforementioned visible light is sent into a light collection cavity and accordingly becomes incident upon visible light sensor 801. Thereafter, the resistance of visible light sensor 801 begins to decrease accordingly. As the resistance of the sensor falls, the voltage across it increases. Eventually, the resistance of visible light sensor 801 decreases a base resistance by some value, for example, 50Ω. A voltage across visible light sensor 801 is relayed to post-calculation circuitry, which then determines what amplitude of light is present based on the voltage, and thus determines a numerical value or calculation result corresponding to the voltage.

Prior to visible light becoming incident upon visible light sensor 801, the sensor is in a high impedance state. This high impedance state can be referred to as a null state. This null state exists to provide a reference point from which positive and negative values can be calculated. That is to say, the null state reference point can be understood as an undefined point on a number line regardless of positive and negative values. Before any operands have been inputted to the system, a null state will be read out by the output circuitry. After inputting a first value, the second step in a calculation process is to enter a command, via the input circuitry, indicating an operation to be performed. In the case of this example calculation, the arithmetic operation to be completed is subtraction. After entering a command to use the subtraction operation, infrared light values are used to represent negative numerical values, the input of which is expected after entering the command.

When the second operand of the computation is inputted (i.e., numerical value 63), the present embodiment enters it as a negative value. Accordingly, infrared light of a specific amplitude associated with an operand −63 is sent into the light collection cavity and becomes incident upon infrared light sensor 802, the resistance of infrared light sensor 802 rises. Eventually, the resistance of infrared light sensor 802 increases from a predetermined base value by some value, for example, 300Ω. Since infrared light sensor 802 is in series with visible light sensor 801, the combined resistance changes of the sensors come to 250Ω. This results in an increased total resistance of 750Ω (from a base combined resistance of 500Ω). This increased total resistance accordingly decreases the total voltage across the sensors, and thus the voltage detected by the post-calculation circuitry. The post-calculation circuitry accordingly correlates the detected voltage corresponding to the total resistance of 750 KΩ of the sensors to a calculation result of −48 based on the reduction in voltage from an originally detected voltage corresponding to a total resistance of 500 KΩ corresponding to a calculation result of 0 (i.e., a state in which an operand 0 has been inputted). In this example embodiment, the calculation result decreases as total resistance increases.

This exemplary calculation is additionally explained with reference to FIGS. 9A-9J, which show a graphical representation of total resistance and numerical value in several states. It should be noted that these states are not necessarily a progression and may be interpreted as independent entities. In FIGS. 9A through 9D, one calculation according to states G0 through G3 is shown. In state G0, the total resistance of the sensors is in a null state. That is to say, until operands are inputted to the system, no result is provided. In state G1, visible light of a specific amplitude corresponding to a numerical value of 15 becomes incident upon visible light sensor 801, and the visible light sensor's resistance drops from high impedance to a resistance of 450Ω. In this example embodiment, input of an operand 0 would result in the resistance of the visible light sensor becoming 500Ω. In this way, the total resistance of the sensors changes from a predefined "0 operand" baseline resistance (this value is configured as necessary to suit the needs of the system). As in this state, infrared light sensor 802 is not influenced by infrared light, its resistance is equal to 0Ω. In state G2, infrared light of a specific amplitude corresponding to a numerical value of −63 is incident upon infrared light sensor 802, and the infrared light sensor's resistance has risen from 500Ω to an 800Ω (it is assumed herein that an input of 0 has been received by the positive light sensor, such that the system is not in a null state). The rise in resistance indicates that the input value is a negative number.

In state G3, both visible light of a specific amplitude corresponding to a numerical value of 15 and infrared light of a specific amplitude corresponding to a numerical value of −63 are incident upon their respective sensors, individually resulting in resistance decreases and increases of 50Ω and 300Ω respectively from a base resistance of 500Ω. The combined change in series resistance due to visible light sensor 801 and infrared light sensor 802 is thereby equal to 250Ω, giving a final series resistance of 750Ω.

Figure 9D:
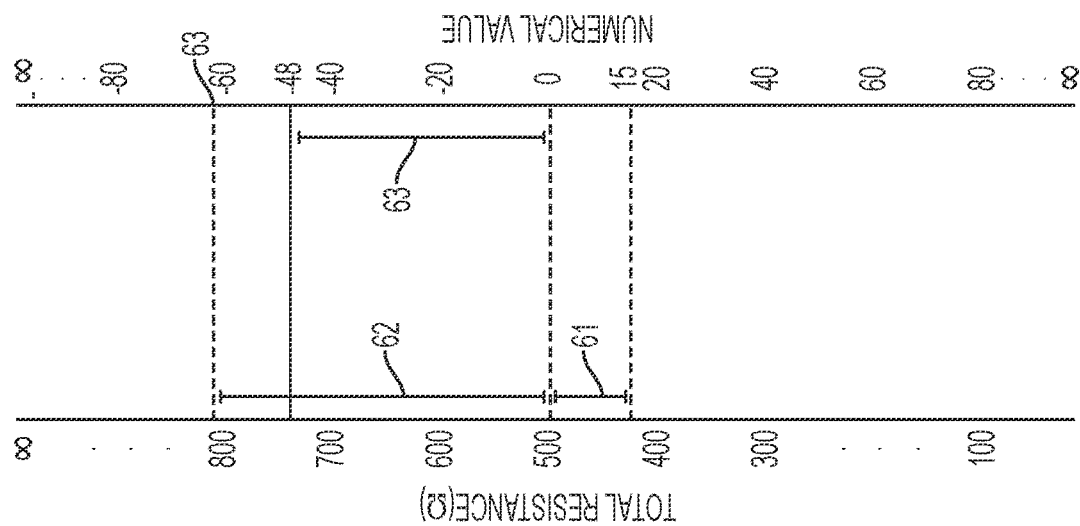
FIG. 9D shows a plot of total resistance and corresponding numerical value versus time according to an example embodiment of the instant application.
Figure 9C:
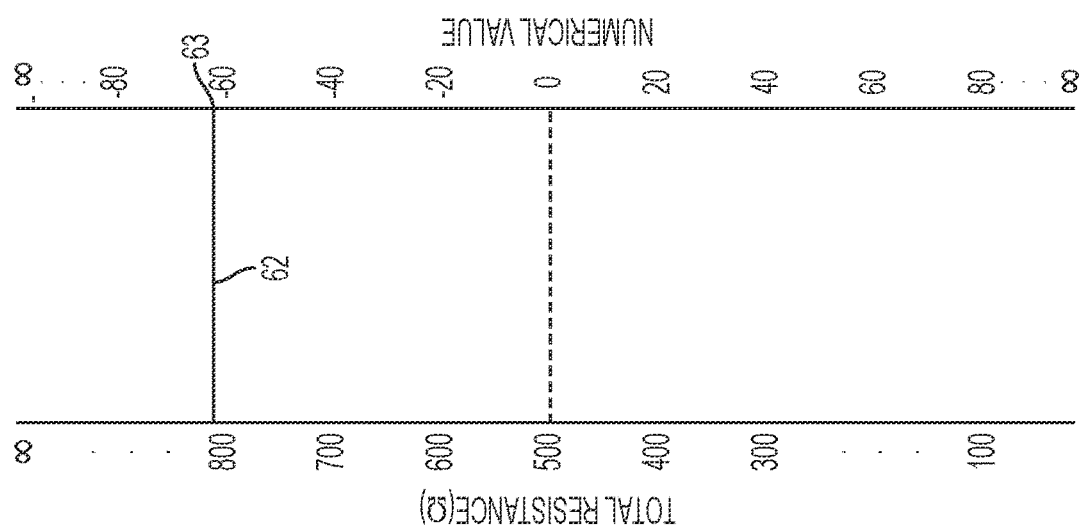
FIG. 9C shows a plot of total resistance and corresponding numerical value versus time according to an example embodiment of the instant application.
Figure 9B:
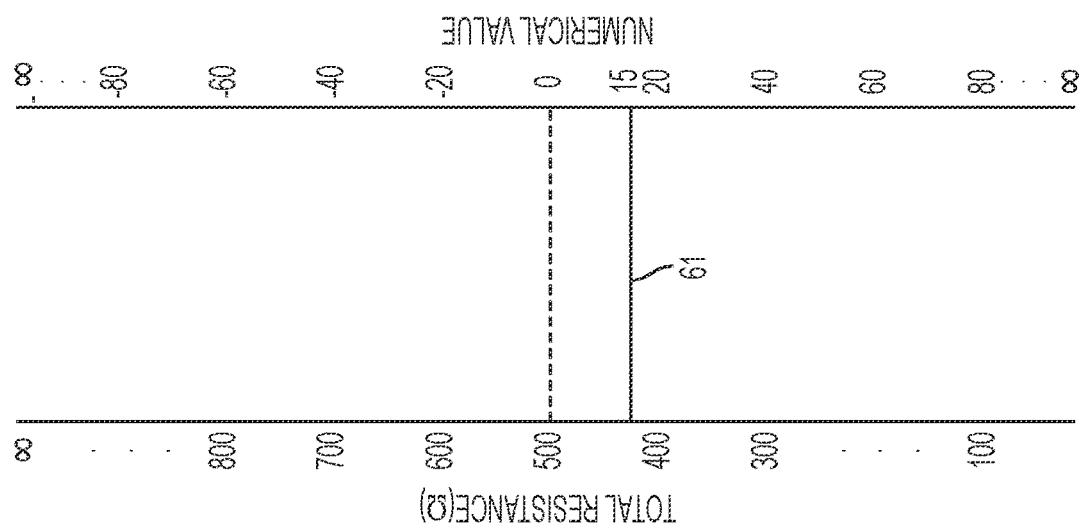
FIG. 9B shows a plot of total resistance and corresponding numerical value versus time according to an example embodiment of the instant application.
Figure 9J:
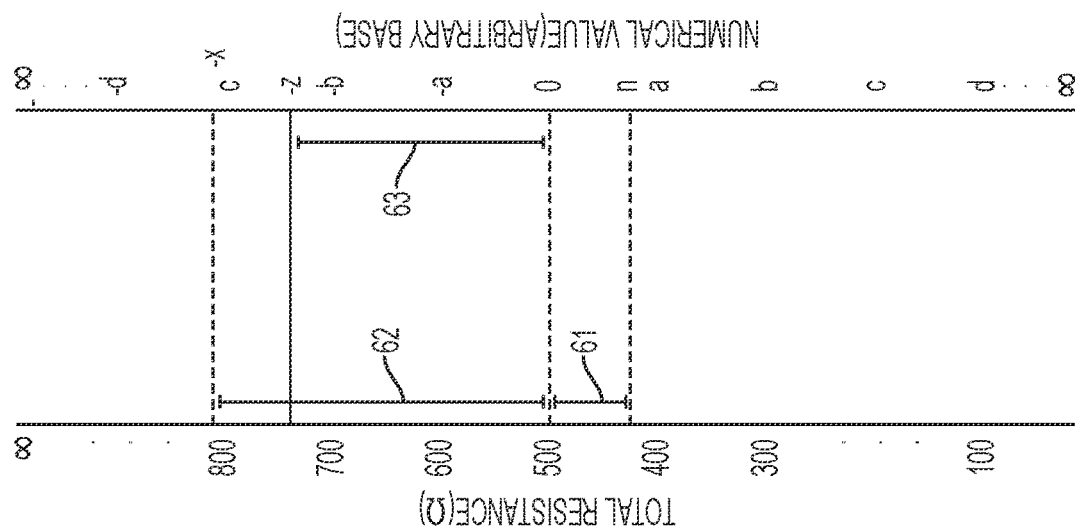
FIG. 9J shows a plot of total resistance and corresponding numerical value versus time according to an example embodiment of the instant application.
Figure 9I:
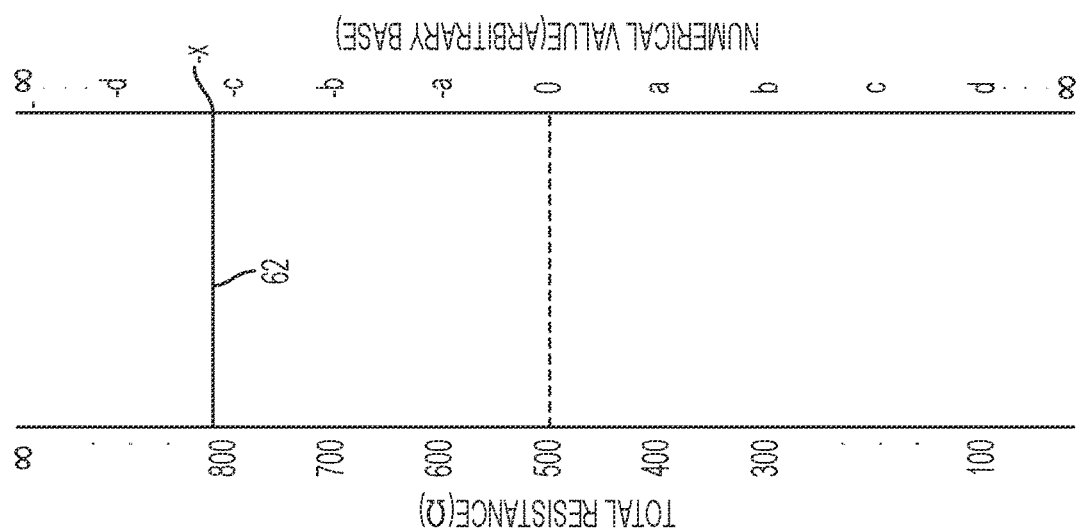
FIG. 9I shows a plot of total resistance and corresponding numerical value versus time according to an example embodiment of the instant application.
Figure 9H:
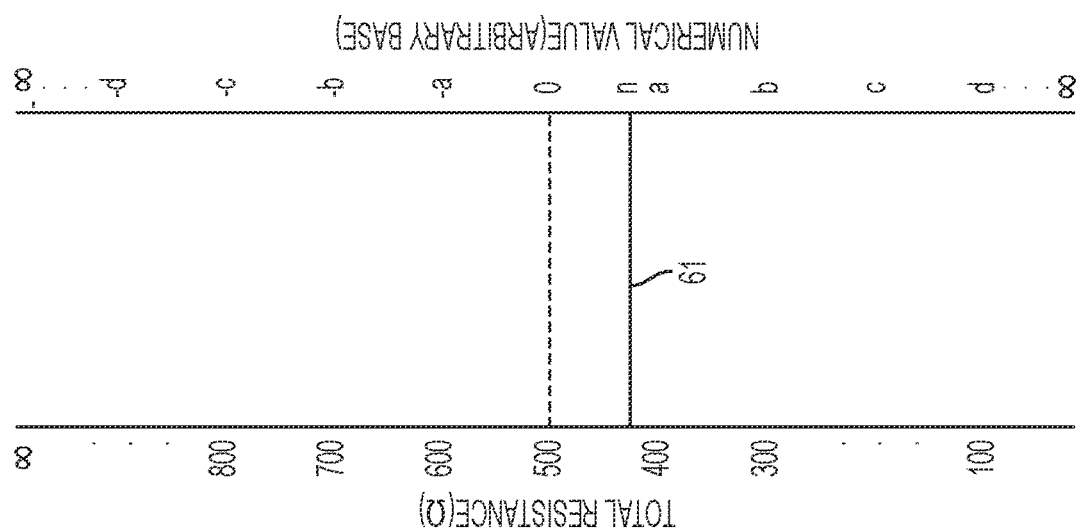
FIG. 9H shows a plot of total resistance and corresponding numerical value versus time according to an example embodiment of the instant application.

On the right side of FIGS. 9A-9J, numerical values corresponding to total resistance scale proportionally with the total resistance of the sensors; thus, the total resistance 750Ω is equal to a numerical value of −48. FIGS. 9E-9G show a similar calculation, except that in this case, the calculation is performed using the hexadecimal base. Similarly, FIGS. 9H-9J show a similar calculation in an arbitrary base. These figures demonstrate that the example embodiments are not limited to a single base system, and in fact may utilize any base system.

The example embodiments according to FIGS. 8A and 8B are not limited to subtraction operations. Indeed, addition operations can be performed using only visible light. Additionally, subtracting a number from itself does not present an issue. That is to say, if a user wishes to perform a subtraction operation such as (6−6=0) or even (6−3=3), the present embodiment is capable of doing so. The primary entry condition which should be met in this embodiment is that a valid (i.e., within a predetermined range) positive numerical value (or value of 0) should be inputted as visible light of a specific amplitude such that the resistance of the visible light sensor falls from a high impedance state (i.e., null state) to some reasonably measurable value.

The operands and corresponding voltages discussed above are provided as examples and are non-limiting. Further embodiments feature far more granular scales in which significantly more numerical values can be calculated; the number thereof is limited primarily by the resolution of a visible light sensor and an infrared light sensor. Additionally, alternative mappings (i.e., non-linear, logarithmic, exponential, etc.) of numerical values to total resistance values, are used in further embodiments. Further embodiments represent positive values with infrared light and negative values with visible light. Yet further, additional embodiments use infrared light to represent both positive and negative values by varying, among other factors, the phase of the infrared light.

An example embodiment of the optical numerical computation apparatus operates using wavelengths in the visible portion of the electromagnetic spectrum, from 315 nm through 710 nm, as well as the near-infrared spectrum, from 800 nm through 2500 nm. This embodiment features, but is not limited to, a visible light sensor such as a photo-resistor or photocell, and an infrared light sensor/detector such as a photo-resistor, photocell, or photodiode. The aforementioned sensors are generally either CdS (Cadmium Sulfide) or CdSe (Cadmium Selenide) based, according to example embodiments. A PbS (Lead Sulfide) or PbSe (Lead Selenide) photo-resistor is generally used to sense light and detect near-infrared wavelengths of light, according to example embodiments. These sensors (visible and infrared) are configured to have a particular resistance value out of a wide range of values (~1-Ω to ~50-MΩ) in accordance with design objectives and error tolerance. In an example embodiment, there is provided at least a logic unit which contains a light containment sphere (LCS) and a light containment cube (LCC). The logic unit, which is largely similar to the same device taught in the related application, performs all valuing (i.e., conversion from analog to digital values). The logic unit performs calculations utilizing light. The LCS is the component into which light is pumped, via fiber-optic cables, regardless of whether they are in the visible or infrared spectrum. The LCC is the component into which light is drained from the LCS, via fiber optics, to be read by the aforementioned sensors. LCC is where the visible and infrared light sensors and their respective filters are housed. These sensors and filters can be collectively referred to as a light amplitude sensing circuit. In the related application, the functions of LCS and LCC were accomplished by a single entity known as the main light containment area. The use of two separate entities (LCS and LCC) allows for increased efficiency and a higher overall system resolution (i.e., more granular amplitudes of light may be used to perform more granular calculations).

It will be appreciated that the foregoing description relates to a new kind of optical numerical computing apparatus where arithmetic operations, specifically addition and subtraction operations, are performed with light instead of binary values. Whereas a binary computer has only two true variable values (0 and 1), and then uses combinations of these values to represent other values, the light-based computer begins with as many variable values as there are distinguishable amplitudes of light. Whereas a binary computer must implement a number of operations to add the values of two or more variables, the light-based computer can add light-based variables in a single, instantaneous operation by commingling them at one time in a light collection cavity. This new kind of computation device has been described, above, in terms of a number of concrete implementations; the person familiar with this field will find other specific implementations to be achievable and well within the scope of the appended claims.

The invention claimed is:
1. An optical numerical computation method comprising:
obtaining operands including a first operand and a second operand;
representing the operands using a numbering system wherein:
the numbering system has a base b and represents numerical values of the operands using n digits in n respective positions where n is an integer and n≥1;
each digit $d_i$ of the n digits of a given operand of the operands has:

a respective position $p_i$ where $0 \leq i < n$, i being an integer,
a respective value $v_i$, such that $0 \leq v_i \leq (b-1)$,
a respective numeric value of $v_i(b^i)$, and
a respective order of magnitude based on $b^i$; and
the operands have a respective least significant digit $d_0$ (LSD) of the n digits in the respective position $p_0$ and a most significant digit $d_{n-1}$ (MSD) of the n digits in the respective position $p_{n-1}$;
providing a plurality of light sources including one or more first light sources for the first operand and one or more second light sources for the second operand, the one or more first light sources including at least a first LSD light source, and the one or more second light sources including at least a second LSD light source;
modulating the first LSD light source to output respective first light at a first wavelength $\lambda_1$ and with a first amplitude proportional to the respective value of the respective least significant digit of the first operand;
modulating the second LSD light source to output respective second light at the first wavelength $\lambda_1$ and with a second amplitude proportional to the respective value of the respective least significant digit of the second operand;
receiving the light from the plurality of light sources inside a light collection cavity that has an inner surface devoid of openings that admit light from other than the plurality of light sources;
providing one or more light sensors; and
sensing the first light and the second light, in the light collection cavity, using a first LSD light sensor of the one or more light sensors, to obtain a first LSD sum of the first amplitude and the second amplitude.

2. The optical numerical computation method of claim 1, further comprising:
providing the one or more first light sources so as to include a first MSD light source;
providing the one or more second light sources so as to include a second MSD light source;
modulating the first MSD light source to output respective third light at a second wavelength $\lambda_2$ and with a third amplitude proportional to the respective value of the respective most significant digit of the first operand;
modulating the second MSD light source to output respective fourth light at the second wavelength and with a fourth amplitude proportional to the respective value of the respective most significant digit of the second operand; and
sensing the third light and the fourth light, in the light collection cavity, using a first MSD light sensor of the one or more light sensors, to obtain a first MSD sum of the third amplitude and the fourth amplitude.

3. The optical numerical computation method of claim 2, further comprising:
obtaining the operands to include a third operand and a fourth operand;
the third operand and the fourth operand representing negative numbers;
providing the plurality of light sources including one or more third light sources for the third operand and one or more fourth light sources for the fourth operand, the one or more third light sources including at least a third LSD light source and a third MSD light source, and the one or more fourth light sources including at least a fourth LSD light source and a fourth MSD light source;
modulating the third LSD light source to output respective fifth light at a third wavelength $\lambda_3$ and with a fifth amplitude proportional to the respective value of the respective least significant digit of the third operand;
modulating the fourth LSD light source to output respective sixth light at the third wavelength $\lambda_3$ and with a sixth amplitude proportional to the respective value of the respective least significant digit of the fourth operand;
modulating the third MSD light source to output respective seventh light at a fourth wavelength $\lambda_4$ and with a seventh amplitude proportional to the respective value of the respective most significant digit of the third operand;
modulating the fourth MSD light source to output respective eighth light at the fourth wavelength $\lambda_4$ and with an eighth amplitude proportional to the respective value of the respective most significant digit of the fourth operand;
sensing the fifth light and the sixth light, in the light collection cavity, using a second LSD light sensor of the one or more light sensors, to obtain a second LSD sum of the fifth amplitude and the sixth amplitude; and
sensing the seventh light and the eighth light, in the light collection cavity, using a second MSD light sensor of the one or more light sensors, to obtain a second MSD sum of the seventh amplitude and the eighth amplitude.

4. The optical numerical computation method of claim 3, further comprising:
scaling the first LSD sum and the first MSD sum according to the respective order of magnitude of the respective least significant digit and the respective order of magnitude of the respective most significant digit of one of the first operand and the second operand to provide a first voltage output representation of a sum of the first operand and the second operand;
scaling the second LSD sum and the second MSD sum according to the respective order of magnitude of the respective most significant digit and the respective order of magnitude of the respective most significant digit of one of the third operand and the fourth operand to provide a second voltage output representation of a sum of the third operand and the fourth operand;
inverting the second voltage output representation and combining it with the first voltage output to determine a calculation result related to the operands; and
generating an output based on the calculation result.

5. The optical numerical computation method of claim 3, further comprising:
providing the one or more first light sources as visible light sources;
providing the one or more second light sources as infrared light sources;
providing the first LSD light sensor and the first MSD light sensor as visible light sensors of the one or more light sensors;
providing the second LSD light sensor and the second MSD light sensor as infrared light sensors of the one or more light sensors;
providing at least one of the one or more light sensors so as to have a respective resistance that increases as sensed light increases, as a first signed sensor;
providing at least one other of the one or more light sensors so as to have a respective resistance that decreases as sensed light increases, as a second signed sensor; and
coupling the first signed sensor in series with the second signed sensor to effect a difference computation.

6. An optical computation method comprising:
receiving a first operand and a second operand for computation;
determining a first sign of the first operand and a second sign of the second operand;
modulating a first light source to a first amplitude in proportion to a first value of the first operand to produce a first light;
modulating a second light source to a second amplitude in proportion to a second value of the second operand to produce a second light;
providing the first light and the second light within a light collection cavity configured with one or more light sensors;
sensing light within the light collection cavity, with the one or more light sensors, to obtain one or more sensed values;
basing a result of the computation on the one or more sensed values;
wherein:
when the first sign matches the second sign, the modulating of the first light and the modulating of the second light is performed at matching wavelengths; and
when the first sign is different from the second sign, the modulating of the first light source and the modulating of the second light source is performed at different wavelengths.

7. The optical computation method as in claim 6, further comprising providing the light collection cavity with a generally spherical shape.

8. The optical computation method as in claim 6, further comprising providing the light collection cavity with a polyhedron shape.

9. The optical computation method as in claim 6, further comprising providing the light collection cavity as a combination of a plurality of adjacent substrates.

10. The optical computation method as in claim 6, further comprising providing a common first filter over the first light source and a first sensor of the one or more light sensors.

11. The optical computation method as in claim 10, further comprising providing a common second filter over the second light source and a second sensor of the one or more light sensors.

12. The optical computation method as in claim 6, further comprising providing a first plurality of the one or more light sensors for the first light source and a second plurality of the one or more light sensors for the second light source.

* * * * *